(12) United States Patent
Burcham et al.

(10) Patent No.: US 7,420,381 B2
(45) Date of Patent: Sep. 2, 2008

(54) DOUBLE SIDED PROBING STRUCTURES

(75) Inventors: Terry Burcham, Hillsboro, OR (US);
Peter McCann, Beaverton, OR (US);
Rod Jones, Gaston, OR (US)

(73) Assignee: Cascade Microtech, Inc., Beaverton, OR (US)

(*) Notice: Subject to any disclaimer, the term of this patent is extended or adjusted under 35 U.S.C. 154(b) by 0 days.

(21) Appl. No.: 11/222,275

(22) Filed: Sep. 8, 2005

(65) Prior Publication Data

US 2006/0043962 A1   Mar. 2, 2006

Related U.S. Application Data

(60) Provisional application No. 60/609,605, filed on Sep. 13, 2004.

(51) Int. Cl.
*G01R 31/26* (2006.01)
*G01R 31/02* (2006.01)

(52) U.S. Cl. ............... 324/754; 324/758; 324/761; 324/765

(58) Field of Classification Search .......... 324/754–765
See application file for complete search history.

(56) References Cited

U.S. PATENT DOCUMENTS

| | | |
|---|---|---|
| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |
| 2,762,234 A | 9/1956 | Dodd |
| 2,901,696 A | 8/1959 | Möllfors |
| 2,921,276 A | 1/1960 | Fubini |
| 3,176,091 A | 3/1965 | Hanson et al. |
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |

(Continued)

FOREIGN PATENT DOCUMENTS

CH   607 045   11/1978

(Continued)

OTHER PUBLICATIONS

The micromanipulator company, data sheet, Double Sided Probing System (Jul. 2002).*

(Continued)

*Primary Examiner*—Ernest F. Karlsen
*Assistant Examiner*—Emily Y Chan
(74) *Attorney, Agent, or Firm*—Chernoff, Vilhauer, McClung & Stenzel

(57) ABSTRACT

A test configuration for double sided probing of a device under test includes a holder to secure the device under test in a first orientation, a calibration substrate secured in a second orientation and a probe capable of calibration using the calibration substrate and probing the device under test.

12 Claims, 44 Drawing Sheets

U.S. PATENT DOCUMENTS

| | | |
|---|---|---|
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Frosch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,487,996 A | 12/1984 | Rabinowitz et al. |
| 4,515,133 A | 5/1985 | Roman |
| 4,515,439 A | 5/1985 | Esswein |
| 4,528,504 A | 7/1985 | Thornton, Jr. et al. |
| 4,552,033 A | 11/1985 | Marzhauser |
| 4,567,321 A | 1/1986 | Harayama |
| 4,588,950 A | 5/1986 | Henley |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Boegh-Petersen |
| 4,711,563 A | 12/1987 | Lass |
| 4,713,347 A | 12/1987 | Mitchell et al. |
| 4,714,873 A | 12/1987 | McPherson et al. |
| 4,725,793 A | 2/1988 | Igarashi |
| 4,727,319 A | 2/1988 | Shahriary |
| 4,727,391 A | 2/1988 | Tajima et al. |
| 4,727,637 A | 3/1988 | Buckwitz et al. |
| 4,734,641 A | 3/1988 | Byrd, Jr. et al. |
| 4,739,259 A | 4/1988 | Hadwin et al. |
| 4,740,764 A | 4/1988 | Gerlack |
| 4,742,571 A | 5/1988 | Letron |
| 4,744,041 A | 5/1988 | Strunk et al. |
| 4,746,857 A * | 5/1988 | Sakai et al. .................. 324/765 |
| 4,749,942 A | 6/1988 | Sang et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,764,723 A | 8/1988 | Strid |
| 4,766,384 A | 8/1988 | Kleinberg et al. |
| 4,772,846 A | 9/1988 | Reeds |
| 4,780,670 A | 10/1988 | Cherry |
| 4,783,625 A | 11/1988 | Harry et al. |
| 4,788,851 A | 12/1988 | Brault |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,810,981 A | 3/1989 | Herstein |

| | | | | | | |
|---|---|---|---|---|---|---|
| 4,812,754 A | 3/1989 | Tracy et al. | | 5,134,365 A | 7/1992 | Okubo et al. |
| 4,818,059 A | 4/1989 | Kakii et al. | | 5,136,237 A | 8/1992 | Smith et al. |
| 4,827,211 A | 5/1989 | Strid et al. | | 5,138,289 A | 8/1992 | McGrath |
| 4,831,494 A | 5/1989 | Arnold et al. | | 5,142,224 A | 8/1992 | Smith et al. |
| 4,835,495 A | 5/1989 | Simonutti | | 5,145,552 A | 9/1992 | Yoshizawa et al. |
| 4,837,507 A | 6/1989 | Hechtman | | 5,148,131 A | 9/1992 | Amboss et al. |
| 4,839,587 A | 6/1989 | Flatley et al. | | 5,159,264 A | 10/1992 | Anderson |
| 4,849,689 A | 7/1989 | Gleason et al. | | 5,159,267 A | 10/1992 | Anderson |
| 4,853,624 A | 8/1989 | Rabjohn | | 5,159,752 A | 11/1992 | Mahant-Shetti et al. |
| 4,853,627 A | 8/1989 | Gleason et al. | | 5,160,883 A | 11/1992 | Blanz |
| 4,858,160 A | 8/1989 | Strid et al. | | 5,164,319 A | 11/1992 | Hafeman et al. |
| 4,859,989 A | 8/1989 | McPherson | | 5,166,606 A | 11/1992 | Blanz |
| 4,864,227 A | 9/1989 | Sato | | 5,172,049 A | 12/1992 | Kiyokawa et al. |
| 4,871,883 A | 10/1989 | Guiol | | 5,172,050 A | 12/1992 | Swapp |
| 4,871,964 A | 10/1989 | Boll et al. | | 5,172,051 A | 12/1992 | Zamborelli |
| 4,888,550 A | 12/1989 | Reid | | 5,177,438 A | 1/1993 | Littlebury et al. |
| 4,891,584 A | 1/1990 | Kamieniecki et al. | | 5,180,977 A | 1/1993 | Huff |
| 4,893,914 A | 1/1990 | Hancock et al. | | 5,187,443 A | 2/1993 | Bereskin |
| 4,894,612 A | 1/1990 | Drake et al. | | 5,198,752 A | 3/1993 | Miyata et al. |
| 4,899,126 A | 2/1990 | Yamada | | 5,198,753 A | 3/1993 | Hamburgen |
| 4,899,998 A | 2/1990 | Feramachi | | 5,202,558 A | 4/1993 | Barker |
| 4,901,012 A | 2/1990 | Gloanec et al. | | 5,202,648 A | 4/1993 | McCandless |
| 4,904,933 A | 2/1990 | Snyder et al. | | 5,207,585 A | 5/1993 | Byrnes et al. |
| 4,904,935 A | 2/1990 | Calma et al. | | 5,214,243 A | 5/1993 | Johnson |
| 4,906,920 A | 3/1990 | Huff et al. | | 5,214,374 A | 5/1993 | St. Onge |
| 4,908,570 A | 3/1990 | Gupta et al. | | 5,225,037 A | 7/1993 | Eldur et al. |
| 4,912,399 A | 3/1990 | Greub et al. | | 5,227,730 A | 7/1993 | King et al. |
| 4,916,002 A | 4/1990 | Carver | | 5,232,789 A | 8/1993 | Platz et al. |
| 4,916,398 A | 4/1990 | Rath | | 5,233,197 A | 8/1993 | Bowman et al. |
| 4,918,373 A | 4/1990 | Newberg | | 5,233,306 A | 8/1993 | Misra |
| 4,918,383 A | 4/1990 | Huff et al. | | 5,245,292 A | 9/1993 | Milesky et al. |
| 4,922,128 A | 5/1990 | Dhong et al. | | 5,266,889 A | 11/1993 | Harwood et al. |
| 4,922,186 A | 5/1990 | Tsuchiya et al. | | 5,266,963 A | 11/1993 | Carter |
| 4,922,912 A | 5/1990 | Watanabe | | 5,267,088 A | 11/1993 | Nomura |
| 4,926,172 A | 5/1990 | Gorsek | | 5,270,664 A | 12/1993 | McMurty et al. |
| 4,929,893 A | 5/1990 | Sato et al. | | 5,274,336 A | 12/1993 | Crook et al. |
| 4,970,386 A | 11/1990 | Buck | | 5,280,156 A | 1/1994 | Niori et al. |
| 4,972,073 A | 11/1990 | Lessing | | 5,289,117 A | 2/1994 | Van Loan et al. |
| 4,975,638 A | 12/1990 | Evans et al. | | 5,293,175 A | 3/1994 | Hemmie et al. |
| 4,980,637 A | 12/1990 | Huff et al. | | 5,298,972 A | 3/1994 | Heffner |
| 4,983,910 A | 1/1991 | Majidi-Ahy et al. | | 5,304,924 A | 4/1994 | Yamano et al. |
| 4,987,100 A | 1/1991 | McBride et al. | | 5,313,157 A | 5/1994 | Pasiecznik, Jr. |
| 4,988,062 A | 1/1991 | London | | 5,315,237 A | 5/1994 | Iwakura et al. |
| 4,991,290 A | 2/1991 | MacKay | | 5,316,435 A | 5/1994 | Monzingo |
| 4,998,062 A | 3/1991 | Ikeda | | 5,317,656 A | 5/1994 | Moslehi et al. |
| 4,998,063 A | 3/1991 | Miller | | 5,321,352 A | 6/1994 | Takebuchi |
| 5,001,423 A | 3/1991 | Abrami | | 5,321,453 A | 6/1994 | Mori et al. |
| 5,003,253 A | 3/1991 | Majidi-Ahy et al. | | 5,326,412 A | 7/1994 | Schreiber et al. |
| 5,012,186 A | 4/1991 | Gleason | | 5,334,931 A | 8/1994 | Clarke et al. |
| 5,020,219 A | 6/1991 | Leedy | | 5,347,204 A | 9/1994 | Gregory et al. |
| 5,021,186 A | 6/1991 | Ota et al. | | 5,355,079 A | 10/1994 | Evans et al. |
| 5,030,907 A | 7/1991 | Yih et al. | | 5,357,211 A | 10/1994 | Bryson et al. |
| 5,041,782 A | 8/1991 | Marzan | | 5,360,312 A | 11/1994 | Mozingo |
| 5,045,781 A | 9/1991 | Gleason et al. | | 5,361,049 A | 11/1994 | Rubin et al. |
| 5,059,898 A | 10/1991 | Barsotti et al. | | 5,363,050 A | 11/1994 | Guo et al. |
| 5,061,192 A | 10/1991 | Chapin et al. | | 5,367,165 A | 11/1994 | Toda et al. |
| 5,061,823 A | 10/1991 | Carroll | | 5,369,368 A | 11/1994 | Kassen et al. |
| 5,066,357 A | 11/1991 | Smyth, Jr. et al. | | 5,371,654 A | 12/1994 | Beaman et al. |
| 5,069,628 A | 12/1991 | Crumly | | 5,373,231 A | 12/1994 | Boll et al. |
| 5,082,627 A | 1/1992 | Stanbro | | 5,374,938 A | 12/1994 | Hatazawa et al. |
| 5,084,671 A | 1/1992 | Miyata et al. | | 5,376,790 A | 12/1994 | Linker et al. |
| 5,089,774 A | 2/1992 | Nakano | | 5,383,787 A | 1/1995 | Switky et al. |
| 5,091,692 A | 2/1992 | Ohno et al. | | 5,389,885 A | 2/1995 | Swart |
| 5,091,732 A | 2/1992 | Mileski et al. | | 5,395,253 A | 3/1995 | Crumly |
| 5,095,891 A | 3/1992 | Reitter | | 5,397,855 A | 3/1995 | Ferlier |
| 5,097,101 A | 3/1992 | Trobough | | 5,404,111 A | 4/1995 | Mori et al. |
| 5,097,207 A | 3/1992 | Blanz | | 5,408,188 A | 4/1995 | Katoh |
| 5,101,453 A | 3/1992 | Rumbaugh | | 5,408,189 A | 4/1995 | Swart et al. |
| 5,107,076 A | 4/1992 | Bullock et al. | | 5,412,330 A | 5/1995 | Ravel et al. |
| 5,116,180 A | 5/1992 | Fung et al. | | 5,412,866 A | 5/1995 | Woith et al. |
| 5,126,286 A | 6/1992 | Chance | | 5,414,565 A | 5/1995 | Sullivan et al. |
| 5,126,696 A | 6/1992 | Grote et al. | | 5,422,574 A | 6/1995 | Kister |
| 5,133,119 A | 7/1992 | Afshari et al. | | 5,430,813 A | 7/1995 | Anderson et al. |

| | | | | | |
|---|---|---|---|---|---|
| 5,441,690 A | 8/1995 | Ayala-Esquilin et al. | 5,670,888 A | 9/1997 | Cheng |
| 5,451,884 A | 9/1995 | Sauerland | 5,672,816 A | 9/1997 | Park et al. |
| 5,453,404 A | 9/1995 | Leedy | 5,675,499 A | 10/1997 | Lee et al. |
| 5,457,398 A | 10/1995 | Schwindt et al. | 5,675,932 A | 10/1997 | Mauney |
| 5,463,324 A | 10/1995 | Wardwell et al. | 5,676,360 A | 10/1997 | Boucher et al. |
| 5,467,024 A | 11/1995 | Swapp | 5,678,210 A | 10/1997 | Hannah |
| 5,469,324 A | 11/1995 | Henderson et al. | 5,685,232 A | 11/1997 | Inoue |
| 5,475,316 A | 12/1995 | Hurley et al. | 5,686,317 A | 11/1997 | Akram et al. |
| 5,476,211 A | 12/1995 | Khandros | 5,686,960 A | 11/1997 | Sussman et al. |
| 5,477,011 A | 12/1995 | Singles et al. | 5,688,618 A | 11/1997 | Hulderman et al. |
| 5,478,748 A | 12/1995 | Akins, Jr. et al. | 5,700,844 A | 12/1997 | Hederick et al. |
| 5,479,108 A | 12/1995 | Cheng | 5,704,355 A | 1/1998 | Bridges |
| 5,479,109 A | 12/1995 | Lau et al. | 5,715,819 A | 2/1998 | Svenson et al. |
| 5,481,196 A | 1/1996 | Nosov | 5,720,098 A | 2/1998 | Kister |
| 5,481,936 A | 1/1996 | Yanagisawa | 5,723,347 A | 3/1998 | Kirano et al. |
| 5,487,999 A | 1/1996 | Farnworth | 5,726,211 A | 3/1998 | Hedrick et al. |
| 5,488,954 A | 2/1996 | Sleva et al. | 5,728,091 A | 3/1998 | Payne et al. |
| 5,493,070 A | 2/1996 | Habu | 5,729,150 A | 3/1998 | Schwindt |
| 5,493,236 A | 2/1996 | Ishii et al. | 5,731,920 A | 3/1998 | Katsuragawa |
| 5,500,606 A | 3/1996 | Holmes | 5,742,174 A | 4/1998 | Kister et al. |
| 5,505,150 A | 4/1996 | James et al. | 5,744,971 A | 4/1998 | Chan et al. |
| 5,506,498 A | 4/1996 | Anderson et al. | 5,748,506 A | 5/1998 | Bockelman |
| 5,506,515 A | 4/1996 | Godshalk et al. | 5,751,153 A | 5/1998 | Bockelman |
| 5,507,652 A | 4/1996 | Wardwell | 5,751,252 A | 5/1998 | Phillips |
| 5,510,792 A | 4/1996 | Ono et al. | 5,756,021 A | 5/1998 | Bedrick et al. |
| 5,511,010 A | 4/1996 | Burns | 5,756,908 A | 5/1998 | Knollmeyer et al. |
| 5,512,835 A | 4/1996 | Rivera et al. | 5,764,070 A | 6/1998 | Pedder |
| 5,517,126 A | 5/1996 | Yamaguchi | 5,767,690 A | 6/1998 | Fujimoto |
| 5,521,518 A | 5/1996 | Higgins | 5,772,451 A | 6/1998 | Dozier, II et al. |
| 5,521,522 A | 5/1996 | Abe et al. | 5,773,780 A | 6/1998 | Eldridge et al. |
| 5,523,694 A | 6/1996 | Cole, Jr. | 5,777,485 A | 7/1998 | Tanaka et al. |
| 5,528,158 A | 6/1996 | Sinsheimer et al. | 5,785,538 A | 7/1998 | Beaman et al. |
| 5,530,372 A | 6/1996 | Lee et al. | 5,792,668 A | 8/1998 | Fuller et al. |
| 5,531,022 A | 7/1996 | Beaman et al. | 5,793,213 A | 8/1998 | Bockelman et al. |
| 5,532,608 A | 7/1996 | Behfar-Rad et al. | 5,794,133 A | 8/1998 | Kashima |
| 5,537,372 A | 7/1996 | Albrecht et al. | 5,803,607 A | 9/1998 | Jones et al. |
| 5,539,323 A | 7/1996 | Davis, Jr. | 5,804,607 A | 9/1998 | Hedrick et al. |
| 5,539,676 A | 7/1996 | Yamaguchi | 5,804,982 A | 9/1998 | Lo et al. |
| 5,550,481 A | 8/1996 | Holmes et al. | 5,804,983 A | 9/1998 | Nakajima et al. |
| 5,561,378 A | 10/1996 | Bockelman et al. | 5,806,181 A | 9/1998 | Khandros et al. |
| 5,565,788 A | 10/1996 | Burr et al. | 5,807,107 A | 9/1998 | Bright et al. |
| 5,565,881 A | 10/1996 | Phillips et al. | 5,810,607 A | 9/1998 | Shih et al. |
| 5,569,591 A | 10/1996 | Kell et al. | 5,811,751 A | 9/1998 | Leona et al. |
| 5,571,324 A | 11/1996 | Sago et al. | 5,811,982 A | 9/1998 | Beaman et al. |
| 5,578,932 A | 11/1996 | Adamian | 5,813,847 A | 9/1998 | Eroglu et al. |
| 5,583,445 A | 12/1996 | Mullen | 5,814,847 A | 9/1998 | Shihadeh et al. |
| 5,584,120 A | 12/1996 | Roberts | 5,820,014 A | 10/1998 | Dozier, II et al. |
| 5,584,608 A | 12/1996 | Gillespie | 5,821,763 A | 10/1998 | Beaman et al. |
| 5,589,781 A | 12/1996 | Higgens et al. | 5,824,494 A | 10/1998 | Feldberg |
| 5,594,358 A | 1/1997 | Ishikawa et al. | 5,829,128 A | 11/1998 | Eldridge et al. |
| 5,600,256 A | 2/1997 | Woith et al. | 5,829,437 A | 11/1998 | Bridges |
| 5,601,740 A | 2/1997 | Eldridge et al. | 5,831,442 A | 11/1998 | Heigl |
| 5,610,529 A | 3/1997 | Schwindt | 5,832,601 A | 11/1998 | Eldridge et al. |
| 5,611,008 A | 3/1997 | Yap | 5,833,601 A | 11/1998 | Swartz et al. |
| 5,617,035 A | 4/1997 | Swapp | 5,838,160 A | 11/1998 | Beaman et al. |
| 5,621,333 A | 4/1997 | Long et al. | 5,841,288 A | 11/1998 | Meaney et al. |
| 5,621,400 A | 4/1997 | Corbi | 5,841,342 A | 11/1998 | Hegmann et al. |
| 5,623,213 A | 4/1997 | Liu et al. | 5,846,708 A | 12/1998 | Hollis et al. |
| 5,623,214 A | 4/1997 | Pasiecznik, Jr. | 5,847,569 A | 12/1998 | Ho et al. |
| 5,627,473 A | 5/1997 | Takami | 5,848,500 A | 12/1998 | Kirk |
| 5,628,057 A | 5/1997 | Phillips et al. | 5,852,232 A | 12/1998 | Samsavar et al. |
| 5,629,838 A | 5/1997 | Knight et al. | 5,852,871 A | 12/1998 | Khandros |
| 5,631,571 A | 5/1997 | Spaziani et al. | 5,854,608 A | 12/1998 | Leisten |
| 5,633,780 A | 5/1997 | Cronin | 5,864,946 A | 2/1999 | Eldridge et al. |
| 5,635,846 A | 6/1997 | Beaman et al. | 5,867,073 A | 2/1999 | Weinreb et al. |
| 5,642,298 A | 6/1997 | Mallory et al. | 5,869,326 A | 2/1999 | Hofmann |
| 5,644,248 A | 7/1997 | Fujimoto | 5,869,974 A | 2/1999 | Akram et al. |
| 5,653,939 A | 8/1997 | Hollis et al. | 5,874,361 A | 2/1999 | Collins et al. |
| 5,656,942 A | 8/1997 | Watts et al. | 5,876,082 A | 3/1999 | Kempf et al. |
| 5,659,421 A | 8/1997 | Rahmel et al. | 5,878,486 A | 3/1999 | Eldridge et al. |
| 5,666,063 A | 9/1997 | Abercrombie et al. | 5,879,289 A | 3/1999 | Yarush et al. |
| 5,669,316 A | 9/1997 | Faz et al. | 5,883,522 A | 3/1999 | O'Boyle |
| 5,670,322 A | 9/1997 | Eggers et al. | 5,883,523 A | 3/1999 | Ferland et al. |

| | | | | | |
|---|---|---|---|---|---|
| 5,884,398 A | 3/1999 | Eldridge et al. | 6,066,911 A | 5/2000 | Lindemann et al. |
| 5,888,075 A | 3/1999 | Hasegawa et al. | 6,071,009 A | 6/2000 | Clyne |
| 5,892,539 A | 4/1999 | Colvin | 6,078,183 A | 6/2000 | Cole, Jr. |
| 5,896,038 A | 4/1999 | Budnaitis et al. | 6,078,500 A | 6/2000 | Beaman et al. |
| 5,900,737 A | 5/1999 | Graham et al. | 6,090,261 A | 7/2000 | Mathieu |
| 5,900,738 A | 5/1999 | Khandros et al. | 6,091,236 A | 7/2000 | Piety et al. |
| 5,903,143 A | 5/1999 | Mochizuki et al. | 6,091,255 A | 7/2000 | Godfrey |
| 5,905,421 A | 5/1999 | Oldfield | 6,091,256 A | 7/2000 | Long et al. |
| 5,910,727 A | 6/1999 | Fujihara et al. | 6,096,567 A | 8/2000 | Kaplan et al. |
| 5,912,046 A | 6/1999 | Eldridge et al. | 6,100,815 A | 8/2000 | Pailthorp |
| 5,914,613 A | 6/1999 | Gleason et al. | 6,104,201 A | 8/2000 | Beaman et al. |
| 5,914,614 A | 6/1999 | Beaman et al. | 6,104,206 A | 8/2000 | Verkull |
| 5,916,689 A | 6/1999 | Collins et al. | 6,110,823 A | 8/2000 | Eldridge et al. |
| 5,917,707 A | 6/1999 | Khandros et al. | 6,114,864 A | 9/2000 | Soejima et al. |
| 5,923,180 A | 7/1999 | Botka et al. | 6,114,865 A | 9/2000 | Lagowski et al. |
| 5,926,029 A | 7/1999 | Ference et al. | 6,118,287 A | 9/2000 | Boll et al. |
| 5,926,951 A | 7/1999 | Khandros et al. | 6,118,894 A | 9/2000 | Schwartz et al. |
| 5,940,965 A | 8/1999 | Uhling et al. | 6,121,836 A | 9/2000 | Vallencourt |
| 5,944,093 A | 8/1999 | Viswanath | 6,124,725 A | 9/2000 | Sato |
| 5,945,836 A | 8/1999 | Sayre et al. | 6,127,831 A | 10/2000 | Khoury et al. |
| 5,949,383 A | 9/1999 | Hayes et al. | 6,130,536 A | 10/2000 | Powell et al. |
| 5,949,579 A | 9/1999 | Baker | 6,137,302 A | 10/2000 | Schwindt |
| 5,959,461 A | 9/1999 | Brown et al. | 6,144,212 A | 11/2000 | Mizuta |
| 5,963,364 A | 10/1999 | Leong et al. | 6,147,502 A | 11/2000 | Fryer et al. |
| 5,966,645 A | 10/1999 | Davis | 6,147,851 A | 11/2000 | Anderson |
| 5,970,429 A | 10/1999 | Martin | 6,150,186 A | 11/2000 | Chen et al. |
| 5,973,504 A | 10/1999 | Chong | 6,160,407 A | 12/2000 | Nikawa |
| 5,974,662 A | 11/1999 | Eldridge et al. | 6,166,553 A | 12/2000 | Sinsheimer |
| 5,977,783 A | 11/1999 | Takayama et al. | 6,168,974 B1 | 1/2001 | Chang et al. |
| 5,981,268 A | 11/1999 | Kovacs et al. | 6,169,410 B1 | 1/2001 | Grace et al. |
| 5,982,166 A | 11/1999 | Mautz | 6,172,337 B1 | 1/2001 | Johnsgard et al. |
| 5,983,493 A | 11/1999 | Eldridge et al. | 6,174,744 B1 | 1/2001 | Watanabe et al. |
| 5,993,611 A | 11/1999 | Moroney, III et al. | 6,175,228 B1 | 1/2001 | Zamborelli et al. |
| 5,994,152 A | 11/1999 | Khandros et al. | 6,181,144 B1 | 1/2001 | Hembree et al. |
| 5,995,914 A | 11/1999 | Cabot | 6,181,149 B1 | 1/2001 | Godfrey et al. |
| 5,996,102 A | 11/1999 | Haulin | 6,181,297 B1 | 1/2001 | Leisten |
| 5,998,228 A | 12/1999 | Eldridge et al. | 6,181,416 B1 | 1/2001 | Falk |
| 5,998,768 A | 12/1999 | Hunter et al. | 6,184,053 B1 | 2/2001 | Eldridge et al. |
| 5,998,864 A | 12/1999 | Khandros et al. | 6,184,587 B1 | 2/2001 | Khandros et al. |
| 5,999,268 A | 12/1999 | Yonezawa et al. | 6,184,845 B1 | 2/2001 | Leisten et al. |
| 6,001,760 A | 12/1999 | Katsuda et al. | 6,191,596 B1 | 2/2001 | Abiko |
| 6,002,426 A | 12/1999 | Back et al. | 6,194,720 B1 | 2/2001 | Li et al. |
| 6,006,002 A | 12/1999 | Motok et al. | 6,206,273 B1 | 3/2001 | Beaman et al. |
| 6,013,586 A | 1/2000 | McGhee et al. | 6,208,225 B1 | 3/2001 | Miller |
| 6,019,612 A | 2/2000 | Hasegawa et al. | RE37,130 E | 4/2001 | Fiori, Jr. |
| 6,023,103 A | 2/2000 | Chang et al. | 6,211,663 B1 | 4/2001 | Moulthrop et al. |
| 6,028,435 A | 2/2000 | Nikawa | 6,211,837 B1 | 4/2001 | Crouch et al. |
| 6,029,344 A | 2/2000 | Khandros et al. | 6,215,196 B1 | 4/2001 | Eldridge et al. |
| 6,031,383 A | 2/2000 | Streib et al. | 6,215,295 B1 | 4/2001 | Smith, III |
| 6,032,356 A | 3/2000 | Eldridge et al. | 6,215,670 B1 | 4/2001 | Khandros |
| 6,032,714 A | 3/2000 | Fenton | 6,218,910 B1 | 4/2001 | Miller |
| 6,033,935 A | 3/2000 | Dozier, II et al. | 6,222,031 B1 | 4/2001 | Wakabayashi et al. |
| 6,034,533 A | 3/2000 | Tervo et al. | 6,222,970 B1 | 4/2001 | Wach et al. |
| 6,037,785 A | 3/2000 | Higgins | 6,229,327 B1 | 5/2001 | Boll et al. |
| 6,040,739 A | 3/2000 | Wedeen et al. | 6,232,149 B1 | 5/2001 | Dozier, II et al. |
| 6,042,712 A | 3/2000 | Mathieu | 6,232,787 B1 | 5/2001 | Lo et al. |
| 6,043,563 A | 3/2000 | Eldridge et al. | 6,232,788 B1 | 5/2001 | Schwindt et al. |
| 6,046,599 A | 4/2000 | Long et al. | 6,232,789 B1 | 5/2001 | Schwindt |
| 6,049,216 A | 4/2000 | Yang et al. | 6,233,613 B1 | 5/2001 | Walker et al. |
| 6,049,976 A | 4/2000 | Khandros | 6,236,223 B1 | 5/2001 | Brady et al. |
| 6,050,829 A | 4/2000 | Eldridge et al. | 6,242,803 B1 | 6/2001 | Khandros et al. |
| 6,051,422 A | 4/2000 | Kovacs et al. | 6,242,929 B1 | 6/2001 | Mizuta |
| 6,052,653 A | 4/2000 | Mazur et al. | 6,245,692 B1 | 6/2001 | Pearce et al. |
| 6,054,651 A | 4/2000 | Fogel et al. | 6,246,247 B1 | 6/2001 | Eldridge et al. |
| 6,054,869 A | 4/2000 | Hutton et al. | 6,251,595 B1 | 6/2001 | Gordon et al. |
| 6,059,982 A | 5/2000 | Palagonia et al. | 6,255,126 B1 | 7/2001 | Mathiue et al. |
| 6,060,888 A | 5/2000 | Blackham et al. | 6,256,882 B1 | 7/2001 | Gleason et al. |
| 6,060,892 A | 5/2000 | Yamagata | 6,257,564 B1 | 7/2001 | Avneri et al. |
| 6,061,589 A | 5/2000 | Bridges et al. | 6,265,950 B1 | 7/2001 | Schmidt et al. |
| 6,062,879 A | 5/2000 | Beaman et al. | 6,268,015 B1 | 7/2001 | Mathieu et al. |
| 6,064,213 A | 5/2000 | Khandros et al. | 6,268,016 B1 | 7/2001 | Bhatt et al. |
| 6,064,217 A | 5/2000 | Smith | 6,274,673 B1 | 8/2001 | Furuta et al. |
| 6,064,218 A | 5/2000 | Godfrey et al. | 6,274,823 B1 | 8/2001 | Khandros et al. |

| Patent | Date | Inventor |
|---|---|---|
| 6,275,043 B1 | 8/2001 | Muhlberger et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 * | 5/2002 | Tarter et al. .................. 324/765 |
| 6,396,298 B1 | 5/2002 | Young et al. |
| 6,400,168 B2 | 6/2002 | Matsunaga et al. |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge et al. |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B2 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,941 B2 | 8/2003 | Abe |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,617,866 B1 | 9/2003 | Ickes |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |

| | | |
|---|---|---|
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,741,129 B1 | 5/2004 | Corsi et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,759,859 B2 | 7/2004 | Deng et al. |
| 6,764,869 B2 | 7/2004 | Eldridge et al. |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,934 B2 | 9/2004 | Betti-Berutto et al. |
| 6,794,950 B2 | 9/2004 | Du Toit et al. |
| 6,798,225 B2 | 9/2004 | Miller |
| 6,798,226 B2 * | 9/2004 | Altmann et al. ............. 324/754 |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,816,840 B1 | 11/2004 | Goodwin, III |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,893 B2 | 1/2005 | Khandros et al. |
| 6,839,964 B2 | 1/2005 | Henson |
| 6,845,491 B2 | 1/2005 | Miller et al. |
| 6,850,082 B2 | 2/2005 | Schwindt |
| 6,856,129 B2 | 2/2005 | Thomas et al. |
| 6,856,150 B2 | 2/2005 | Sporck et al. |
| 6,862,727 B2 | 3/2005 | Stevens |
| 6,864,105 B2 | 3/2005 | Grube et al. |
| 6,864,694 B2 | 3/2005 | McTigue |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,859 B2 | 9/2005 | Karavakis et al. |
| 6,946,860 B2 | 9/2005 | Cheng et al. |
| 6,948,391 B2 | 9/2005 | Brassell et al. |
| 6,948,981 B2 | 9/2005 | Pade |

| | | |
|---|---|---|
| 6,949,942 B2 | 9/2005 | Eldridge et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,071,722 B2 | 7/2006 | Yamada et al. |
| 7,088,981 B2 | 8/2006 | Chang |
| 7,096,133 B1 | 8/2006 | Martin et al. |
| 7,161,363 B2 | 1/2007 | Gleason et al. |
| 7,173,433 B2 * | 2/2007 | Hoshi et al. ................ 324/601 |
| 7,187,188 B2 | 3/2007 | Andrews et al. |
| 7,188,037 B2 | 3/2007 | Hidehira |
| 7,271,603 B2 | 9/2007 | Gleason et al. |
| 2001/0002794 A1 | 6/2001 | Draving et al. |
| 2001/0009061 A1 | 7/2001 | Gleason et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0070743 A1 | 6/2002 | Felici et al. |
| 2002/0070745 A1 | 6/2002 | Johnson et al. |
| 2002/0079911 A1 | 6/2002 | Schwindt |
| 2002/0109088 A1 | 8/2002 | Nara et al. |
| 2002/0118034 A1 | 8/2002 | Laureanti |
| 2002/0149377 A1 | 10/2002 | Hefti et al. |
| 2002/0153909 A1 * | 10/2002 | Petersen et al. ............. 324/754 |
| 2002/0163769 A1 | 11/2002 | Brown |
| 2002/0168659 A1 | 11/2002 | Hefti et al. |
| 2002/0176160 A1 | 11/2002 | Suzuki et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0072549 A1 | 4/2003 | Facer et al. |
| 2003/0076585 A1 | 4/2003 | Ledley |
| 2003/0077649 A1 | 4/2003 | Cho et al. |
| 2003/0088180 A1 | 5/2003 | Van Veen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0155939 A1 | 8/2003 | Lutz et al. |
| 2003/0170898 A1 | 9/2003 | Gunderson et al. |
| 2003/0184332 A1 | 10/2003 | Tomimatsu et al. |
| 2003/0215966 A1 | 11/2003 | Rolda et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Theis |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0140819 A1 | 7/2004 | McTigue et al. |
| 2004/0147034 A1 | 7/2004 | Gore et al. |
| 2004/0162689 A1 | 8/2004 | Jamneala et al. |
| 2004/0170312 A1 | 9/2004 | Soenksen |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0201388 A1 * | 10/2004 | Barr ............................ 324/754 |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0068054 A1 | 3/2005 | Mok et al. |
| 2005/0083130 A1 | 4/2005 | Grilo |
| 2005/0088191 A1 | 4/2005 | Lesher |
| 2005/0101846 A1 | 5/2005 | Fine et al. |
| 2005/0116730 A1 * | 6/2005 | Hsu ............................ 324/754 |
| 2005/0142033 A1 | 6/2005 | Glezer et al. |

| | | | | | | |
|---|---|---|---|---|---|---|
| 2005/0151548 A1 | 7/2005 | Hayden et al. | | JP | 62-51235 | 3/1987 |
| 2005/0156675 A1 | 7/2005 | Rohde et al. | | JP | 62-098634 | 5/1987 |
| 2005/0164160 A1 | 7/2005 | Gunter et al. | | JP | 62-107937 | 5/1987 |
| 2005/0165316 A1 | 7/2005 | Lowery et al. | | JP | 62098634 | 5/1987 |
| 2005/0168722 A1 | 8/2005 | Forstner et al. | | JP | 62107937 | 5/1987 |
| 2005/0174191 A1 | 8/2005 | Brunker et al. | | JP | 62-179126 | 8/1987 |
| 2005/0178980 A1 | 8/2005 | Skidmore et al. | | JP | 62-239050 | 10/1987 |
| 2005/0195124 A1 | 9/2005 | Puente Baliarda et al. | | JP | 62239050 | 10/1987 |
| 2005/0229053 A1 | 10/2005 | Sunter | | JP | 62295374 | 12/1987 |
| 2005/0236587 A1 | 10/2005 | Kodama et al. | | JP | 63-108736 | 5/1988 |
| 2005/0237102 A1 | 10/2005 | Tanaka | | JP | 63-129640 | 6/1988 |
| 2006/0030060 A1 | 2/2006 | Noguchi et al. | | JP | 63-143814 | 6/1988 |
| 2006/0052075 A1 | 3/2006 | Galivanche et al. | | JP | 63-152141 | 6/1988 |
| 2006/0155270 A1 | 7/2006 | Hancock et al. | | JP | 63-192246 | 8/1988 |
| 2006/0184041 A1 | 8/2006 | Andrews et al. | | JP | 63-318745 | 12/1988 |
| 2006/0220663 A1 * | 10/2006 | Oikawa .................. 324/718 | | JP | 64-21309 | 2/1989 |
| 2006/0226864 A1 | 10/2006 | Kramer | | JP | 1-165968 | 6/1989 |
| 2007/0024506 A1 | 2/2007 | Hardacker | | JP | 1-214038 | 8/1989 |
| 2007/0030021 A1 | 2/2007 | Cowan et al. | | JP | 01209380 | 8/1989 |
| | | | | JP | 1-219575 | 9/1989 |
| FOREIGN PATENT DOCUMENTS | | | | JP | 1-296167 | 11/1989 |
| CN | 1083975 | 3/1994 | | JP | 2-22836 | 1/1990 |
| DE | 2951072 | 7/1981 | | JP | 2-124469 | 5/1990 |
| DE | 3426565 | 1/1986 | | JP | 2-141681 | 5/1990 |
| DE | 3637549 | 5/1988 | | JP | 02124469 | 5/1990 |
| DE | 288234 | 3/1991 | | JP | 02135804 | 5/1990 |
| DE | 4223658 | 1/1993 | | JP | 2-191352 | 7/1990 |
| DE | 9313420 | 10/1993 | | JP | 3-175367 | 7/1991 |
| DE | 19522774 | 1/1997 | | JP | 3-196206 | 8/1991 |
| DE | 19542955 | 5/1997 | | JP | 3196206 | 8/1991 |
| DE | 19618717 | 1/1998 | | JP | 3-228348 | 10/1991 |
| DE | 19749687 | 5/1998 | | JP | 03228348 | 10/1991 |
| DE | 29809568 | 10/1998 | | JP | 4-130639 | 5/1992 |
| DE | 10000324 | 7/2001 | | JP | 04130639 | 5/1992 |
| DE | 20220754 | 5/2004 | | JP | 4-159043 | 6/1992 |
| EP | 0230766 | 12/1985 | | JP | 04159043 | 6/1992 |
| EP | 0195520 | 9/1986 | | JP | 4-206930 | 7/1992 |
| EP | 0230348 | 7/1987 | | JP | 04206930 | 7/1992 |
| EP | 0259163 | 3/1988 | | JP | 4-340248 | 11/1992 |
| EP | 0259183 | 3/1988 | | JP | 5-082631 | 4/1993 |
| EP | 0259942 | 3/1988 | | JP | 05082631 | 4/1993 |
| EP | 0261986 | 3/1988 | | JP | 5-113451 | 5/1993 |
| EP | 0270422 | 6/1988 | | JP | 51-57790 | 6/1993 |
| EP | 0333521 | 9/1989 | | JP | 5157790 | 6/1993 |
| EP | 0460911 | 12/1991 | | JP | 51-66893 | 7/1993 |
| EP | 0846476 | 6/1998 | | JP | 5166893 | 7/1993 |
| EP | 0 945 736 | 9/1999 | | JP | 6-85044 | 3/1994 |
| EP | 0945736 | 9/1999 | | JP | 60-71425 | 3/1994 |
| GB | 579665 | 8/1946 | | JP | 6-102313 | 4/1994 |
| GB | 2014315 | 8/1979 | | JP | 6-132709 | 5/1994 |
| GB | 2179458 | 3/1987 | | JP | 6154238 | 6/1994 |
| JP | 52-19046 | 2/1977 | | JP | 6-295949 | 10/1994 |
| JP | 53-037077 | 4/1978 | | JP | 7-005078 | 1/1995 |
| JP | 53037077 | 4/1978 | | JP | 7-12871 | 1/1995 |
| JP | 53-052354 | 5/1978 | | JP | 7005078 | 1/1995 |
| JP | 55-115383 | 9/1980 | | JP | 7012871 | 1/1995 |
| JP | 55115383 | 9/1980 | | JP | 8-35987 | 2/1996 |
| JP | 56-007439 | 1/1981 | | JP | 8035987 | 2/1996 |
| JP | 56-88333 | 7/1981 | | JP | 8-261898 | 10/1996 |
| JP | 5691503 | 7/1981 | | JP | 8-330401 | 12/1996 |
| JP | 56088333 | 7/1981 | | JP | 08330401 | 12/1996 |
| JP | 57-075480 | 5/1982 | | JP | 09127432 | 5/1997 |
| JP | 57075480 | 5/1982 | | JP | 10-48256 | 2/1998 |
| JP | 57-163035 | 10/1982 | | JP | 10-116866 | 5/1998 |
| JP | 57163035 | 10/1982 | | JP | 10116866 | 5/1998 |
| JP | 57171805 | 10/1982 | | JP | 11-023975 | 1/1999 |
| JP | 58-130602 | 8/1983 | | JP | 11004001 | 1/1999 |
| JP | 594189 U | 1/1984 | | JP | 11023975 | 1/1999 |
| JP | 60-5462 | 4/1984 | | JP | 2000-329664 | 11/2000 |
| JP | 60-236241 | 11/1985 | | JP | 2001-124676 | 5/2001 |
| JP | 61142802 | 6/1986 | | JP | 2001-189285 | 7/2001 |
| JP | 62-11243 | 1/1987 | | JP | 2001-189378 | 7/2001 |
| | | | | JP | 2002-203879 | 7/2002 |

| JP | 2002-243502 | 8/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO98/07040 | 2/1998 |
| WO | WO 00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

International Search Report for PCT/US06/16238 mailed Feb. 28, 2007.
Written Opinion of the International Searching Authority for PCT/US06/16238, mailed Feb. 28, 2007.
Partial International Search Report for PCT/US2005/039561, mailed Mar. 21, 2006.
International Search Report for PCT/US2005/039561, mailed May 18, 2006.
Written Opinion of the International Searching Authority for PCT/US2005/039561, mailed May 18, 2006.
Cohn, S, "Properties of Ridge Wave Guide," Proceedings of the I.R.E., Aug. 1947, pp. 783-788.
Cohn, Seymour B., "Optimum Design of Stepped Transmission-Line Transformers," I.R.E. Transactions—Microwave Theory and Techniques, No. 3, 1955, pp. 16-21.
Hopper, Samuel, "The Design of Ridged Waveguides," I.R.E. Transactions—Microwave Theory and techniques, No. 5, Oct. 1955, pp. 20-29.
Chen, Tsung-Shan, "Calculation of Parameters of Ridge Waveguides," IRE Transactions on Microwave Theory and Techniques, Jan. 1957, pp. 12-17.
IRE 20.1, Committee Personnel, "IRE Standards on Methods of Measuring Noise in Linear Twoports, 1959," Proc. IRE, vol. 48, pp. 60-68, Jan. 1960, pp. 32-40.
Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.
Beaubien, M.J., et al., "An Accurate Finite-Difference Method for Higher Order Waveguides Modes," IEEE Transactions on Microwave Theory and Techniques, vol. M11-16, No. 12, Dec. 1968, pp. 1007-1017.
Lane, Richard Q., "The Determination of Device Noise Parameters," Proc. IEEE, vol. 57, Aug. 1969, pp. 1461-1462.
Adamian, Vaheh, et al., "A Novel Procedure for Receiver Noise Characterization," IEEE Transactions on Instrumentaton and Measurement, Jun. 1973.
Daly, P., "Polar Geometry Waveguides by finite-element Methods," IEEE Transactions on Microwave Theory and Technique, vol. MTT-22, No. 3, Mar. 1974, pp. 202-209.
Fink, Donald G., et al., "Electronics Engineers' Handbook," Sec. 17-52 Measurement and Control Circuits, 1975, pp. 17-22-17-27.
Bry, A., et al, "Bypass Capacitor for Chip Probe," IBM Technical Disclosure Bulletin, vol. 18, No. 11, Apr. 1976.
Skobern, J.R., "Subminiature High-Frequency Probe," IBM Technical disclosure Bulletin, vol. 19, No. 10, Mar. 1977.
Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.
Gommlich, Hans, et al., "Verzerrungsmessungen-Wichtige Aufgabe in der Ubertragungstechnik," Elektronik 8/ Apr. 23, 1982, pp. 110-119.
Larock, V., et al., "Automatic Noise Temperature Measurement Through Frequency Variation," IEEE Transactions on Microwave Theory and Techniques, vol. MTT-30, No. 8, Aug. 1982, pp. 1286-1288.
Maury Microwave Corp., "Transistor Test Fixture (TTF) Inserts, Calibration & Check Devices, MT951, MT952, MT953 Series," Advanced Data 4T-002, Sep. 20, 1982, pp. 1-2.
Maury Microwave Corp., "Transistor Test Fixture (TTF)," MT950 Series, Advanced data 4T-001, Oct. 7, 1982.
Abbott, D.A., et al., "Automatic noise figure measurments with computer control and correction," 8054 Radio and Electronic Engineer vol. 52, Oct. 1982, pp. 468-474.
Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.
Adamian, V. et al., "Simplified Noise Evaluation of Microwave Receiver," IEEE Transactions on Instrumentation and Measurement, vol. IM-33, No. 2, Jun. 1984, 136-140.
Pastori, William E., "High accuracy microwave noise figure measurements," 8029 Electronic Engineering 56, No. 1984, pp. 181-189.
Inter-Continental Microwave, "Product Catalog," VMC 1055 Jan. 1986.
Design Technique, "Microstrip Microwave Test Fixture," May 1986.
Cascade Microtech, Inc., "Wide Probe Assembly," Full Scale Drawing, May 29, 1986, 2 pages.
Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.
Sharma, A., "Tunable Waveguide-to-Microstrip Transition for Millimeter-Wave Applications," IEE MTT-S Digest 1987, pp. 353-356.
Izadian, Jamal S., "Unified Design Plans Aid Waveguide Transitions," Microwaves & R&F, May 1987, pp. 213-222.
Mazilu, T., "A Self-Adjusting Waveguide-to-Microstrip Transition," Microwave Journal, Jul. 1987, pp. 133-134.
Carlton, D.E. et al., "Accurate Measurement of High-speed Package and Interconnect Parasitics," 1988 Custom Integrated Circuits Conference, pp. 23.3.1-23.3.6.
Fraser, Artur, et al., "GHz On-Silicon-Wafer Probing Calibration Methods," Paper 7.6, IEEE 1988 Bipolar Circuits & Technology Meeting, pp. 154-157.
Modolo, John A., et al., "Wafer level high-frequency measurements of photodetector characteristics," Applied Optics, vol. 27 pp. 3059-3061, Aug. 1988.
Design Technique, "Adjustable Test Fixture," 1988.
Tong, Peter R., et al., "Noise Measurements at MM-Wave Frequencies," 176 Microwave Journal 31, Jul. 1988.
Barsotti, C., et al., "New Probe Cards Replace Needle Types," Semiconductor International, Aug. 1988, pp. 98-101.
Microwave Journal, "Microwave Products," Sep. 1988, pp. 297.
Cascade Microtech Microprobe Update, "Spurious propagation, modes removed by probe absorber," Apr. 1989.
Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.
Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.
Dalman, G.C., "New Waveguide-to-Coplaner Waveguide Transistion for Centimetre and Millimetre Wave Applications," Electronics Letters, Jun. 21, 1990, vol. 26, No. 13.
Cacade Microtech WPH-700 series, "Multicontact High-Speed Integrated Circuit," 1991, 700S-591.
Liu, S.M. Joseph, et al., "A New Probe for W-band On-wafer Measurements," IEEE MTT-S Digest, 1993, pp. 1335-1338.

Photo of Micromanipulator Probe Station, 1994.
Maury Microwave Corp., Transistor Test Fixture (TTF) MT950 Series, May 31, 1995, Advanced Data, 4T-0011.
Cascade Microtech, "Layout rules for WPH-900 Series probes," Applications Note, 1996.
Cascade Microtech, "Air coplanar Probe Series," 1997.
Yong-Dae, Kim , et al. "Fabrication of silicon Micro-Probe for Vertical Probe Card Application," Jpn. J. Appl. Phys. vol. 37, Part 1, No. 12B, Dec. 1998, pp. 7070-7073.
"A Broadband Microwave choke," Microwave Journal, Dec. 1999.
"The Air Coplanar offers a highly compliant, rugged probe with lowest insertion loss available," Cascade Microtech, Inc., Air coplanar Probe Series, 2000.
Cascade Microtech, "On-Wafer Test Solutions for State-of-the-Art Electro-Optical Components," 2001.
Purroy. F. et al., "New Theoretica Analysis of the LRRm Calibration Technique for Vector Network Analyzers," IEEE Transactions on Instrumentation and Measurement, vol. 50, No. 5, Oct. 2001, pp. 1307-1313.
"Laser Diode Test Solution," Oct. 9, 2002, http:/www.cascademicrotech.com/index.cfm/fuseaction/pg.view/pID/136.
Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.
Cascade Microwave, "Introducing the World's First Microwave Wafer Probing Equipment," 4 pages, 1983.
Malm, R.L. "Reduction of Stray Fields About SEM Samples," IBM Technical Disclosure Bulletin, vol. 21, No. 7, Dec. 1978 2 pages.
Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.
L.L. Sohn, O.A.Saleh, G.R. Facer, A.J. Beavis, R.S. Allan, and D.A Notterman, "Capacitance cytometry: Measuring biological cells one by one," PNAS Sep. 26, 2000, vol. 97 No. 20 pp. 10687-10690, www.pnas.org.
Sam Hanash, "insight review articles, Disease proteomics," Nature, vol. 422, Mar. 13, 2003, pp. 226-232.
Mike Tyers and Matthias Mann, "insight overview, From genomics to proteomics," Nature, vol. 422, Mar. 13, 2003, pp. 193-197.
Ruedi Aebersold and Matthias Mann, "insight review articles, Mass spectrometry-based proteomics," Nature, vol. 422, Mar. 13, 2003, pp. 198-207.
Barbara Marte, Senior Editor, "Nature insight Proteomics," Nature vol. 422, Mar. 13, 2003 pp. 191-194.
Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.
Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.
Christophe Risacher, et al., "Wavequide-to-Microstrip Transition With Integrated Bias-T," IEEE Microwave and Wireless Components Letters, vol. 13, No. 7, Jul. 2003, pp. 262-264.
Saswata Basu and Leonard Hayden, "An SOLR Calibration for Accurate Measurement of Orthogonal On-Wafer DUTS," 1997 IEEE MTT-S Digest, pp. 1335-1338.
Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.
Mohammed Nurul Afsar, James R. Birch, and R. N. Clarke, "The Measurement of the Properties of Materials," Proceedings of the IEEE, vol. 74, No. 1, Jan. 1986, pp. 183-199.
M.S. Venkatesh and G.S.V. Raghavan, "An overview of dielectric properties measuring techniques," vol. 47, 2005, Canadian Biosystems Engineering, pp. 7.15-7.30.
Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.
Leonard Hayden, "A Multi-Line TRL Calibration," Feb. 2, 1994, 5 pages.
Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.
Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.
Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.
Cascade Microtech, "Probe Heads Care and cleaning of coaxial input microwave probes," Microwave Probe Care and Cleaning, Instruction Manual, Copyright 1990.
The Micromanipulator Company, data sheet, Double Sided Probing System, Jul. 2002, 2 pages.

* cited by examiner

DOUBLE SIDED PROBING STRUCTURES

CROSS-REFERENCE TO RELATED APPLICATIONS

This application claims the benefit of U.S. Provisional Application No. 60/609,605, filed Sep. 13, 2004.

BACKGROUND OF THE INVENTION

The present application relates to probing.

Characterizing the actual performance of high speed integrated circuit based systems requires accurate knowledge of the electrical characteristics of the wafer forming the integrated circuit, characteristics of the integrated circuit itself, characteristics of the package into which the integrated circuit is placed, characteristics of the circuit board or support upon which the integrated circuit is supported, and characteristics of the interconnect structures which interface both the integrated circuit with the package and the package with the circuit board. These electrical characteristics, which are frequently the subject of measurement, include cross-coupling with neighboring lines, spectral dispersion, electrical resonances, and loss by radiation into the surrounding dielectric.

Traditional measuring stations are constructed to support a device under test, such as an integrated circuit board or package, in a horizontal position. This arrangement provides direct physical access to the probing device from only a single side of the package. Simultaneous access to both sides of a circuit board or package is accordingly unavailable in such test structures. Specially constructed mounting cards are sometimes used which not only hold a package but also attempt to provide all connections on the top of the card for physical access to probing. The use of package mounting cards introduce effects into the measurement data which are not due to the package or its interconnects. These effects must, themselves, be determined and either compensated for or modeled into the final analysis of the data. Regardless of how these effects are handled, they degrade both the efficiency and accuracy of the resulting package electrical characterization.

GigaTest Labs provides a GTL 5050 Probe Station that facilitates probing on opposite sides of a printed circuit board. A calibration substrate is supported in a horizontal orientation by the horizontal support. The probes are supported by the horizontal support and aligned in an opposing relationship with respect to the calibration substrate. Thereafter, the probes are calibrated using the calibration substrate to determine calibration parameters, such as a set of S parameters. The calibration parameters are used in further measurements to calibrate primarily for the effects of the cables and probe so that the characteristics of the device under test can be determined. One of the clamps is then clamped to the horizontal support of the station in a position suitable for testing one side of the circuit board. The horizontal support including the clamped probe is then flipped over. The other clamp is then clamped to the now upper side of the horizontal support of the station in a position suitable for testing the other side of the circuit board. While functional, the significant movement of the probes necessary for positioning and the flipping of the table necessitates long cables, which introduce error into the calibration.

DETAILED DESCRIPTION OF PREFERRED EMBODIMENT

Figure 1:
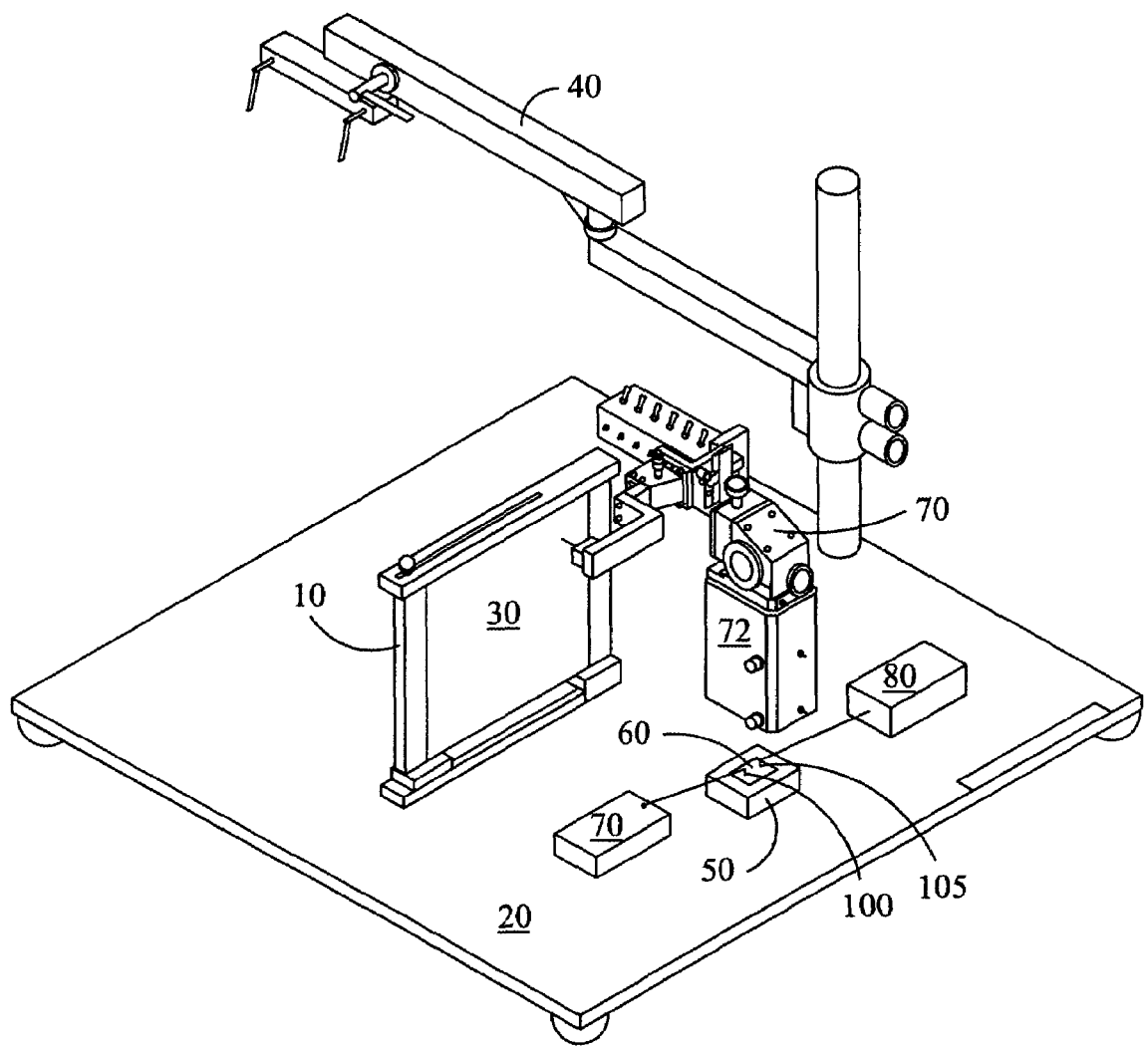
FIG. 1 illustrates a horizontal calibration substrate and a vertical device under test.

The present inventors considered the available dual sided probing solutions and came to the realization that a probing solution that permits dual sided probing with minimal reconfiguration of the probe station would be advantageous for increasing the probing efficiency while simultaneously increasing calibration accuracy. Referring to FIG. 1 as an initial matter it was determined that the device under test 30 is preferably supported by a holder 10 that is in a vertical orientation, such as substantially 90 degrees with respect to a horizontal support 20. The device under test 30, may include any suitable device, such as for example, pogo-pin contactors, grid ball array package I/Os and vias, test sockets, via arrays, printed circuit boards, and thru paths of transmission lines that traverse right-angle board to board connectors. In addition, a differential impedance test may be performed. The vertical orientation of the device under test 30 reduces the size of the probing system and permits effective use of a microscope 40 to view both sides of the device under test 30.

In order to perform calibrated tests, the probing system includes a substrate support 50 for a calibration substrate 60. The calibration substrate includes one or more calibrated structures thereon which facilitate the calibration of one or more probes. The calibration substrate is preferably substantially parallel to the horizontal support 20. A pair of probe positioners 70 and 80 (see FIG. 2) are aligned with the calibration substrate 60. Each of the probe positioners 70 and 80 typically includes a probing element 100 and 105 which includes a respective contacting portion at the end thereof. The probing contacting portion normally includes a plurality of aligned probing contacts. Therefore, the theta of each set of probing contacts is adjusted using the theta adjustment of the probe positioner to align the probing contacts with the surface of the calibration substrate. In this manner, all of the probing contacts come into proper contact with the calibration substrate (otherwise one or more probe contacts may not make proper contact). The calibration is normally a vector calibration using a vector network analyzer.

The probe positioners 70 and 80 are then repositioned on the horizontal support 20 in a position proximate each side of the device under test 30. A stand 72 (or multiple stands) may be used, if desired. While some existing probes may permit the re-orientation of the probing contacts to a different position, it takes significant time to adjust the orientation of the probing contacts sufficiently in line with the device under test 30 for successful probing. In addition, since the adjustment from one orientation to another is normally along a continuous axis of rotation, it is problematic to sufficiently align the probing contacts with the surface of the device under test 30 so that proper probing contact is made. If the probe contacts are slightly out of alignment, then the test will either not function at all or appear to function properly but actually be providing inaccurate results. Further, if the user needs to make multiple touch downs on the same pad to properly align the probing contacts with the pads on the device under test, then there is a significant probability that the pads on the device under test will be damaged, resulting in either a damaged device under test or otherwise inaccurate measurements.

To alleviate this probe alignment limitation the present inventors came to the realization that the probe should include a structure that permits defined movement from a horizontal probing orientation to a vertical probing orientation. In this manner, the probe contacts move from a first orientation to a second orientation with certainty that the orientations have a predefined angular relationship between them, such as 90 degrees.

Figure 2:
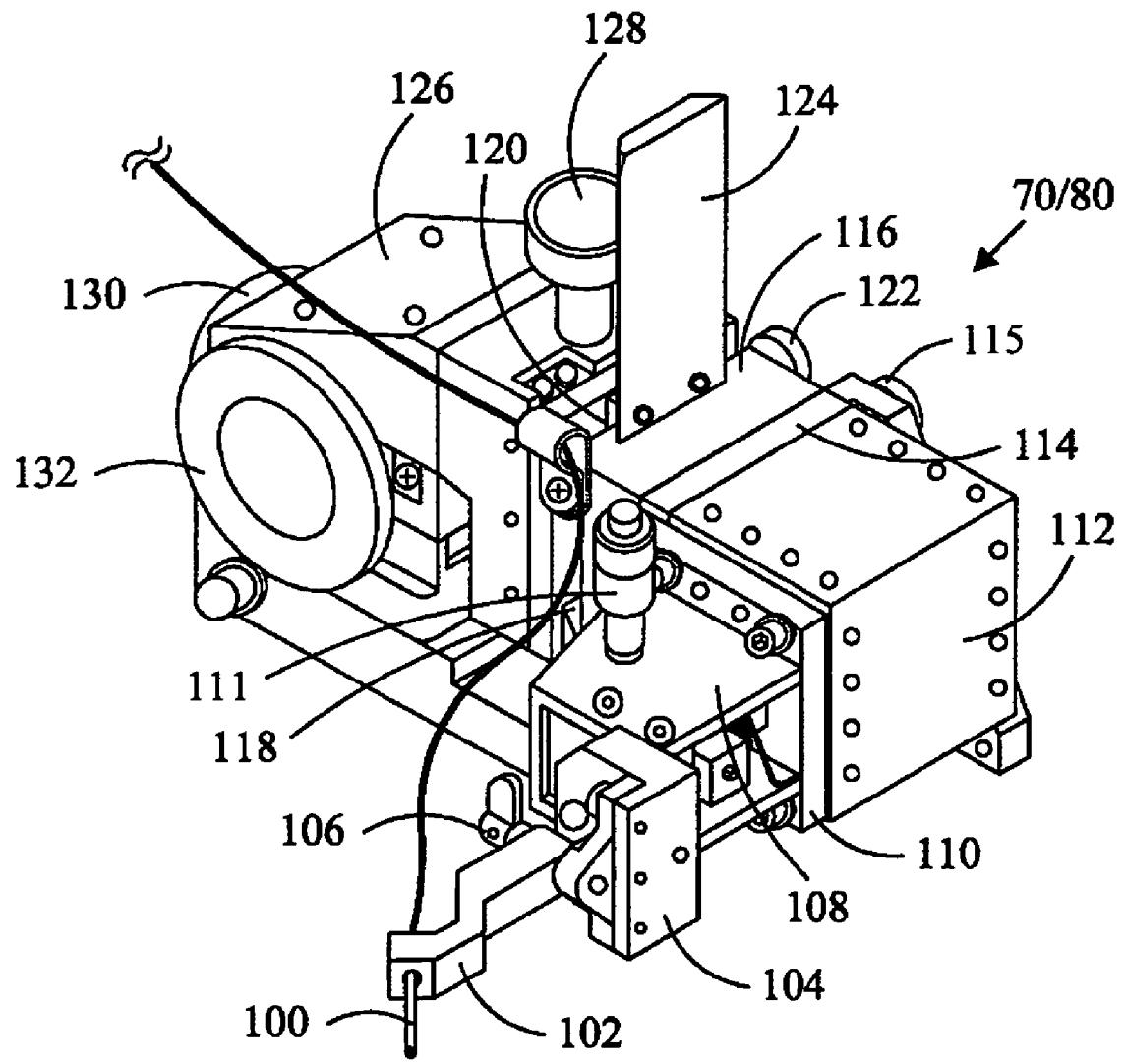
FIG. 2 illustrates a probe positioner.

Referring to FIG. 2, the probe positioner 70 (80) may include a probing element 100 with contacting elements. Typically the probing element 100 includes a coaxial cable with a plurality of contacting elements connected to the end thereof. The probing element 100 is supporting by a probe support 102. The probe support 102 may be rotatably connected 106 to a support fixture 104, such as with a pin that may be tightened to secure the probe support 102 in place. This interconnection 106 provides for adjustability in the location of the probing contacts and their angular contact to the device under test.

Figure 3:
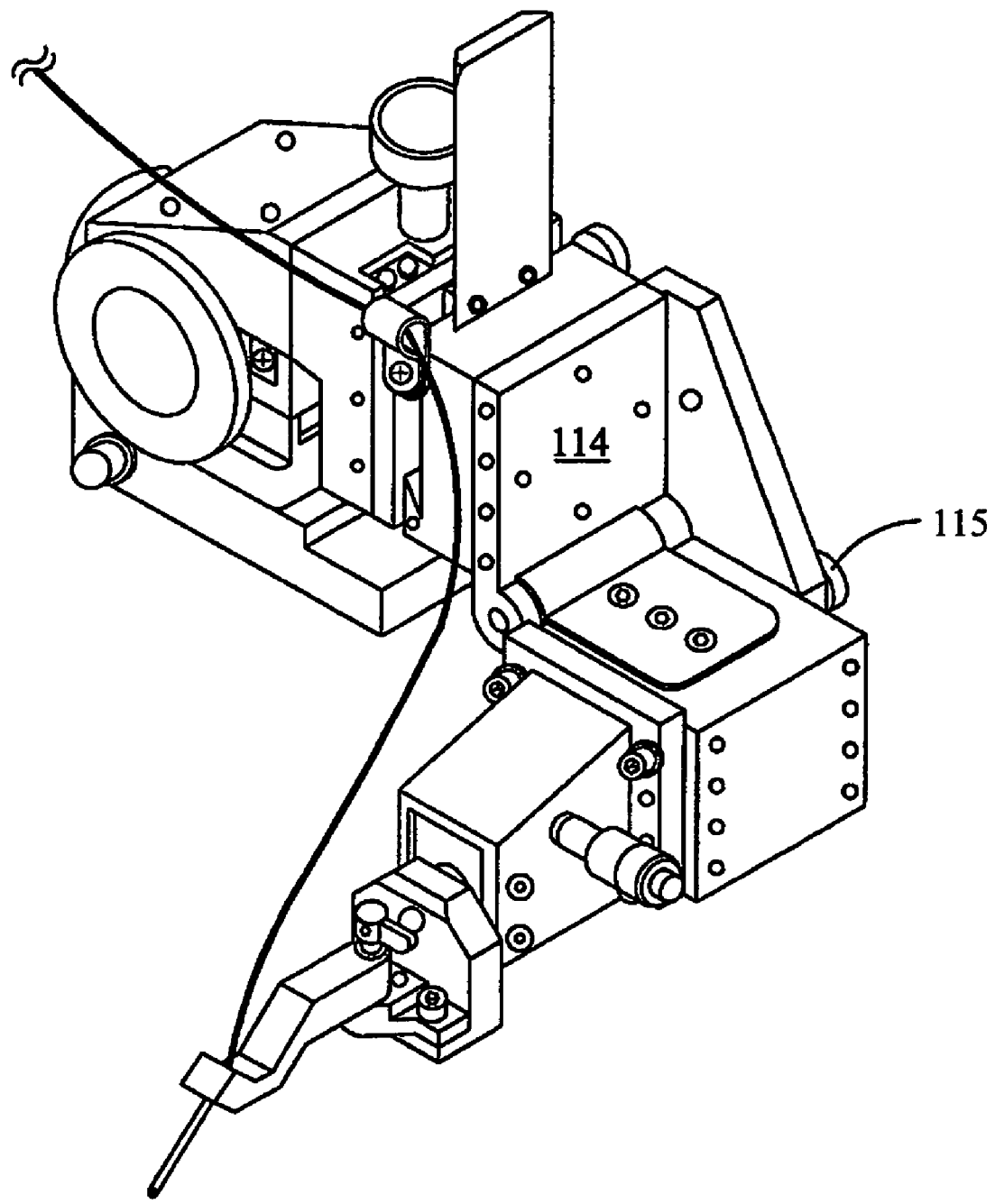
FIG. 3 illustrates the probe positioner of FIG. 2 in a different orientation.

The support fixture 104 is interconnected to a theta adjustment structure 108 that includes a knob 111 that, when turned, adjusts the theta orientation of the probing elements. The theta adjustment structure 108 is secured to a plate 110. The plate 110 includes a set of openings therein which match openings in a pivot block 112 so that the plate 110 may be secured to the pivot block 112. In FIG. 2, the probing element 100 is oriented in a horizontal orientation. In order to provide a convenient manner of adjusting the probing element 100 to a different predetermined orientation, the pivot block 112 is mounted to a hinge 114. When the user desires to change the orientation of the probing element 100, the user may remove a pin 115 which permits the pivot block 112 to pivot around the hinge 114 to a second position where the pin 115 is replaced to secure the pivot block 112 in a fixed position, as illustrated in FIG. 3. The result of removing the pin 115 and pivoting the pivot block 112, is to change the orientation of the probing element 100 by a predetermined angle, such as 90 degrees. Other fixed positional movements may likewise be used depending on the particular application and orientation of different portions of the probe station.

With the probing element 100 oriented in a vertical direction, as illustrated in FIG. 3, the probe is suitable for being calibrated on a calibration substrate that is in a horizontal orientation. The contacting members may be properly adjusted to achieve a uniform contact with the calibration substrate. Thereafter, the probe may be readily modified to a horizontal orientation using the hinge 114 with a 90 degree adjustment. The device under test 30 has a vertical orientation, so the probe as illustrated in FIG. 3, after rotation, is thus in a suitable position for testing. The probe may be moved on the horizontal support 20, as necessary, to position the probing contacts near the device under test. With the 90 degree adjustment being known, which is the angular relationship between the calibration substrate 60 and the device under test 30, the probing contacts will be in the proper alignment for testing the device under test 30. In this manner, no additional adjustment of the probing contacts theta alignment is typically necessary and the pads on the device under test 30 will not likely be worn through attempting to achieve proper alignment of the probing contacts. In addition, each of the probe positioners may be rotated in a different direction so that suitable contact may be made to each side of the device under test 30.

In addition, a plurality of faces of the pivot block 112 may include a set of holes therein so that the plate 110 may be secured to different faces of the pivot block 112, as desired. In this manner, the rotation of the pivot block 112 may achieve different orientations of the probe.

The hinge 114 is affixed to another support 116. The support 116 may include a pair of opposing groves 118 and 120 defined therein. By loosening a screw 122, the support 116 may freely slide up and down the plate 124, and is secured in place by tightening the screw 122. In this manner, the height of the plate 116 may be readily adjusted. The opposing groves 118 and 120 also permit the plate 116 to be completely disengaged from the plate 124 then the plate 116 (and attached probing elements) may be rotated 90 degrees, 180 degrees, or 270 degrees, and then engaged with the plate 124 in a different orientation. This provides another manner for adjusting the orientation of the probe for alignment with a calibration substrate and a device under test.

The plate 124 is secured to an x-y-z adjustment mechanism 126 that may shift the probe by using a respective knobs 132, 130, and 128. In this manner, fine adjustments of the x-y-z orientation of the probe 100 may be performed by the user for probing the device under test.

Figure 4:
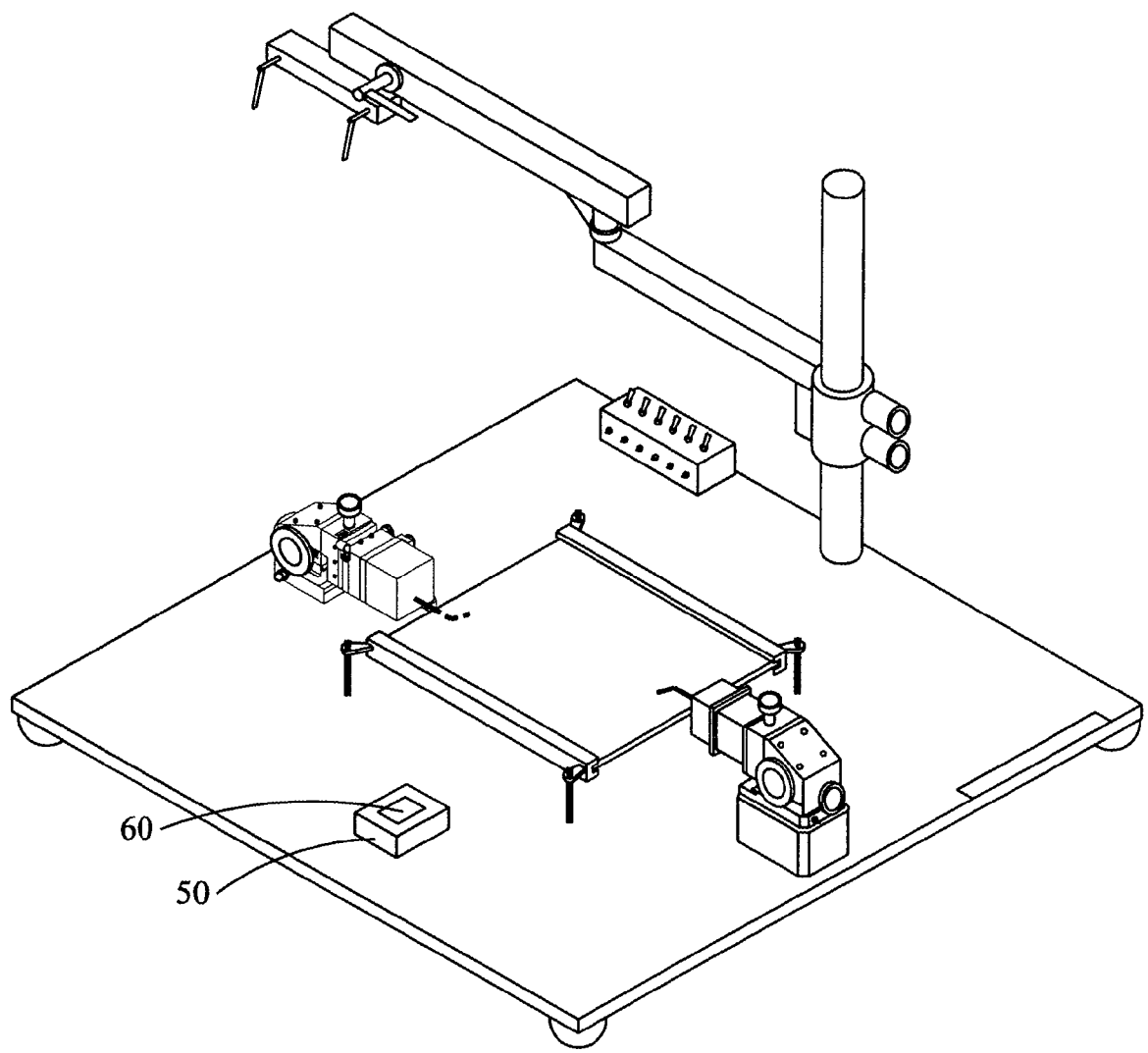
FIG. 4 illustrates a horizontal calibration substrate and a horizontal device under test.

Referring to FIG. 4, an alternative orientation is illustrated that makes effective use of the probe positioners described herein. The calibration substrate is maintained in a horizontal orientation, and the probes are calibrated. Thereafter one of the probe positioners is oriented to probe the top of the device under test, which is the same orientation of the probe as is used for calibration. The probing contacts of the other probe positioner are rotated 180 degrees, and then oriented to probe the bottom of the device under test. In this manner, the device under test may be effectively probed.

Figure 5:
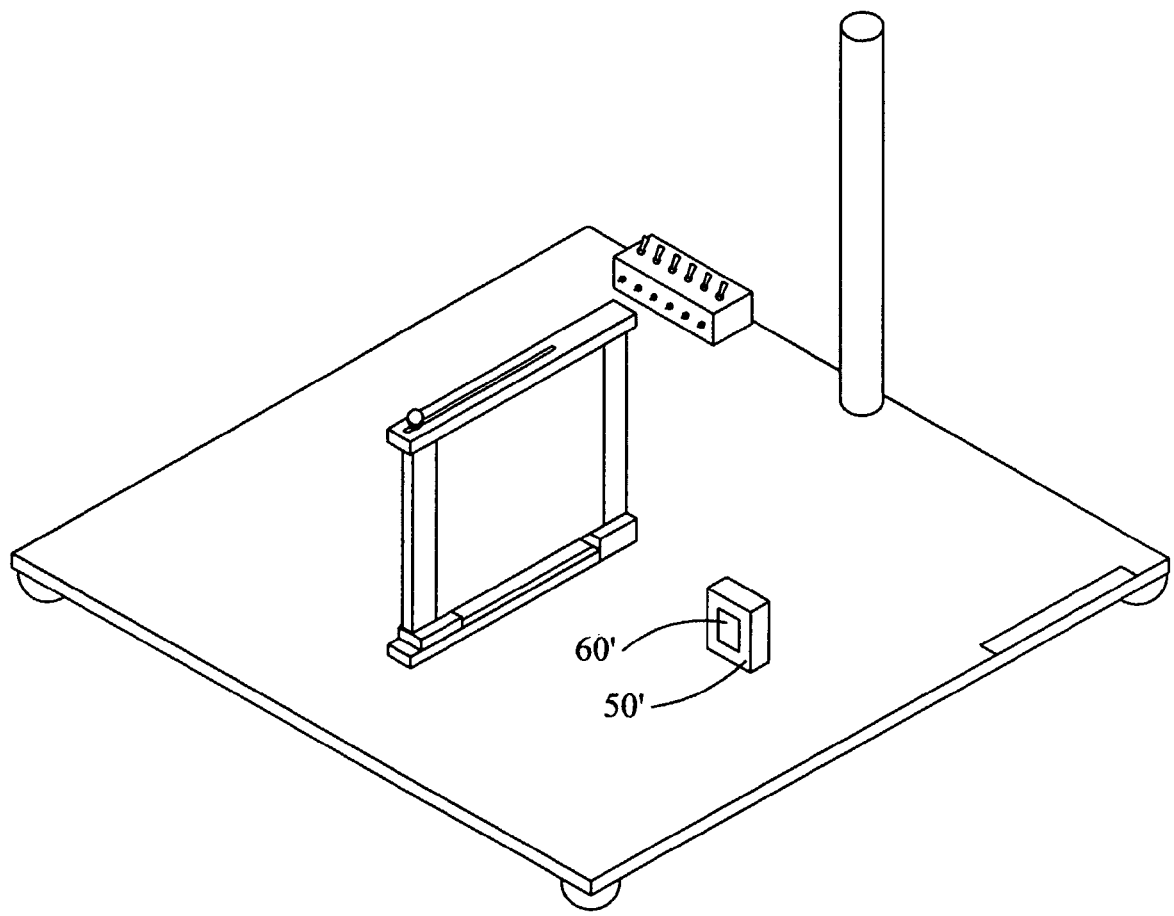
FIG. 5 illustrates a vertical calibration substrate and a vertical device under test.

Referring to FIG. 5, another alternative orientation is illustrated that makes effective use of the probe positioners described herein. The calibration substrate 60' is maintained in a vertical orientation on the support 50', and the probes are calibrated. Thereafter one of the probe positioners is oriented to probe the side of the device under test, which is the same orientation of the probe as is used for calibration. The probing contacts of the other probe positioner are rotated 180 degrees, and then oriented to probe the other side of the device under test. In this manner, the device under test may be effectively probed.

Figure 6:
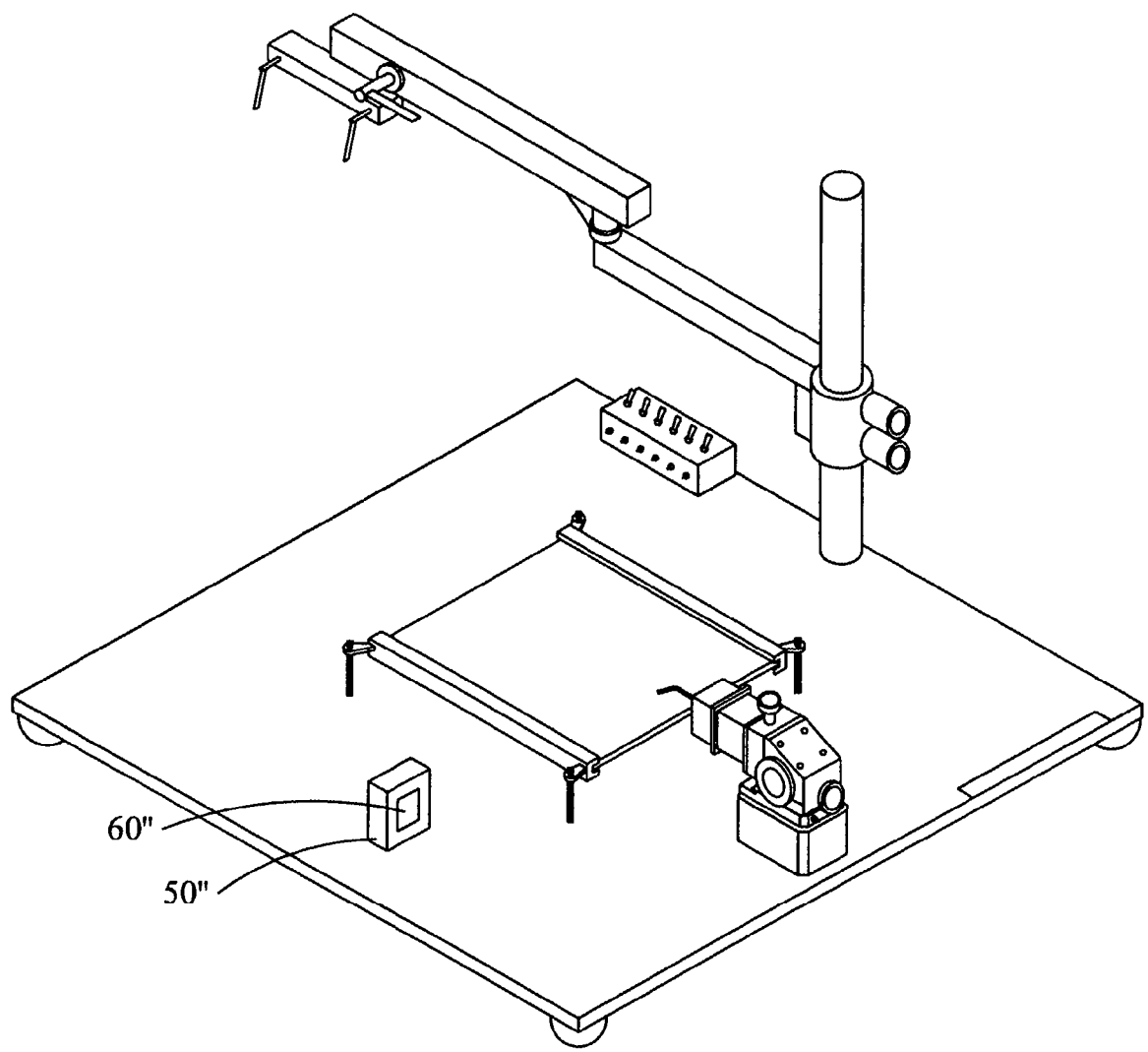
FIG. 6 illustrates a vertical calibration substrate and a horizontal device under test.

Referring to FIG. 6, another alternative orientation is illustrated that makes effective use of the probe positioners described herein. The calibration substrate 60" is maintained in a vertical orientation on the support 50", and the probes are calibrated. Thereafter one of the probe positioners is oriented to probe the top of the device under test. The probing contacts of the other probe positioner are rotated and then oriented to probe the other side of the device under test. In this manner, the device under test may be effectively probed.

It is to be understood, that depending on the orientation of the probe positioners including the probing element, calibration substrate, and the device under test with respect to one another together with respect to the orientation of the probe positioners when positioned for subsequent probing, the modification of the orientation of the probing element (if modified) may change.

Figure 7:
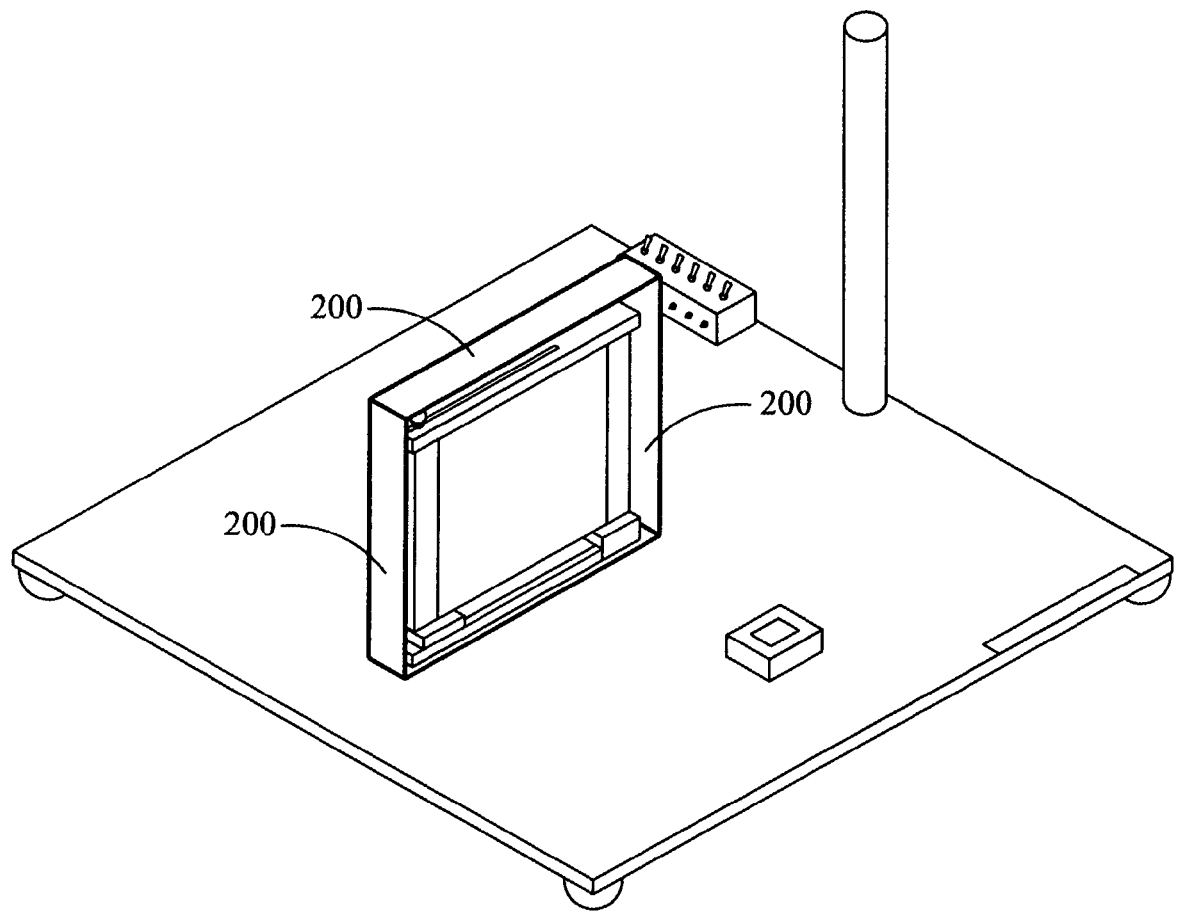
FIG. 7 illustrates a lateral plate assembly interconnected to a guard potential.
Figure 8:
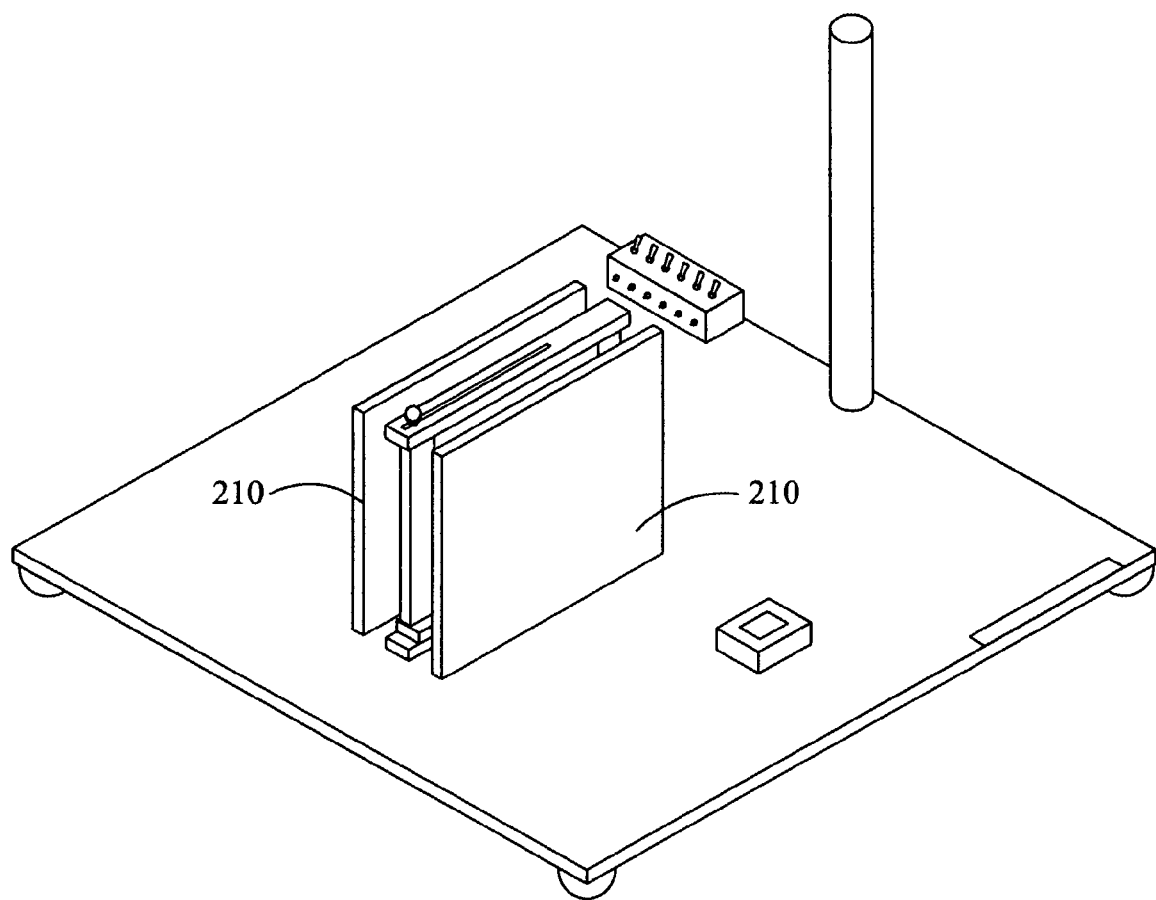
FIG. 8 illustrates a pair of plate assemblies interconnected to a guard potential.

Traditionally, the measurements used to simultaneously test two sides of a vertically oriented structure have been sufficient to obtain desirable results. However, in the case of attempting to characterize especially low noise characteristics it has been determined that the noise levels, in some cases, are to large. In such a case it has been determined that the addition of guarding structures around the vertically oriented probing device would be advantageous. The guarding structures are conductive members that are provided with a potential that tracks, or otherwise approximates, the potential in the signal path. In this manner, the leakage from the signal path is reduced. Referring to FIG. 7, a modified vertical support structure includes an exterior ring 200 that is provided with a guard potential of a signal path. The exterior of the ring is preferably insulated from other conductive members. In addition, the exterior ring preferably encircles a majority of the device under test on one or more sides of the device under test. Referring to FIG. 8, for one or both of the exterior surfaces of the device under test a conductive plate assembly 210 may be provided, within which the probes test the device under test, and each of the conductive plates may be connected to a guard potential of a signal path. For example, the potential of the conductive plate proximate the respective probe may be interconnected to a guard representative of the signal path of the respective probe.

Figure 9:
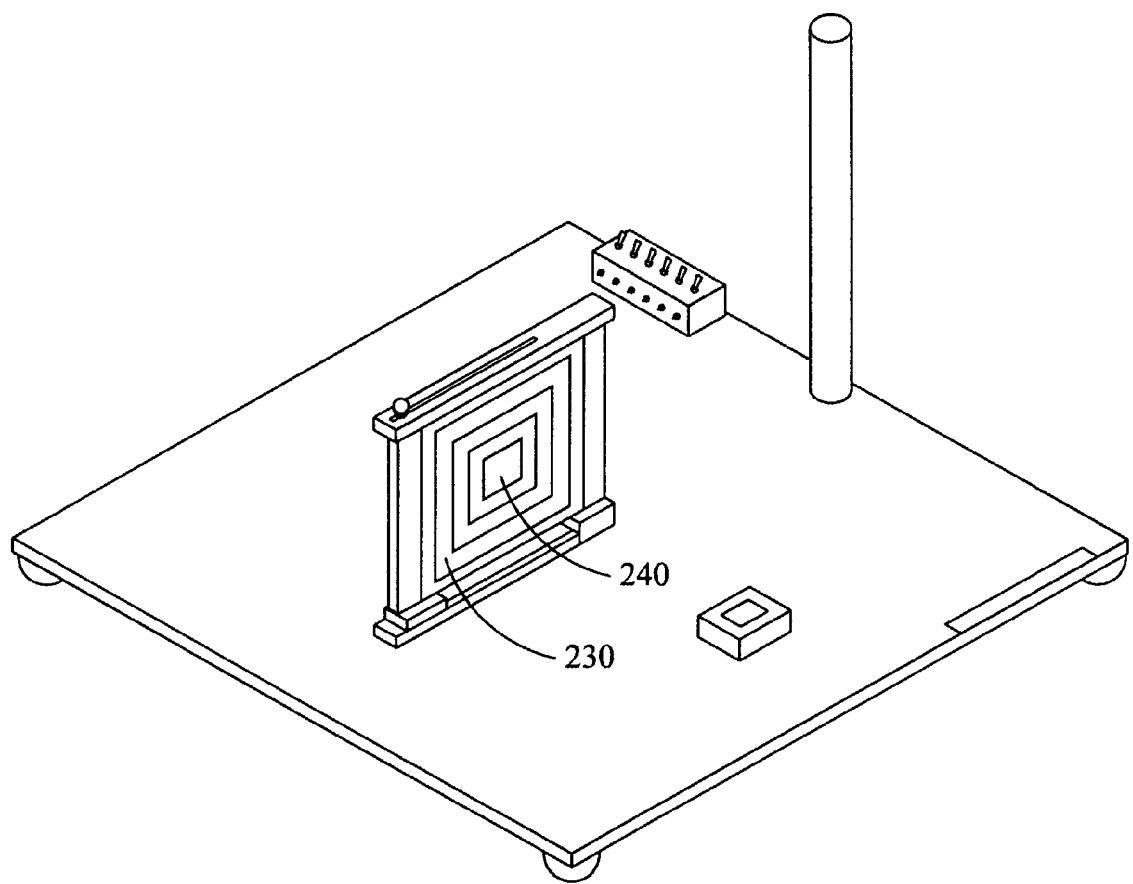
FIG. 9 illustrates a vertical sliding plate assembly interconnected (both sides of device under test) to a guard potential.

Referring to FIG. 9, a modified structure includes a set of vertically oriented interconnected slidable plates 230 that define an opening 240 therein through which the probe tests the device under test. The plates 230 may be provided on one or both sides of the device under test. The opening 240 may shift such that other regions of the device under test may be tested. In this manner, the device under test has a significant region that is of a guard potential.

Figure 10A:
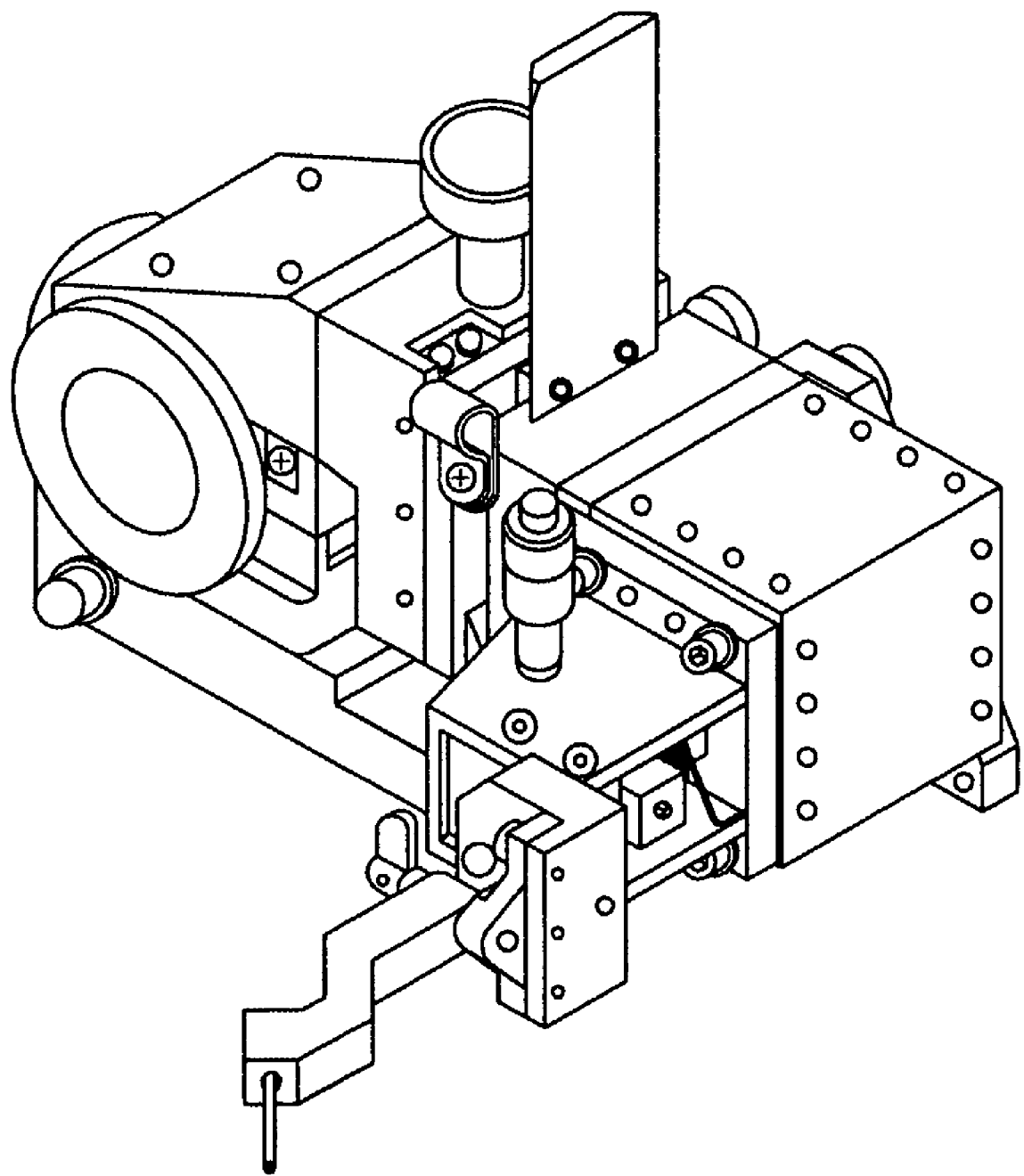
FIG. 10A-NN illustrate further embodiments.
Figure 10B:
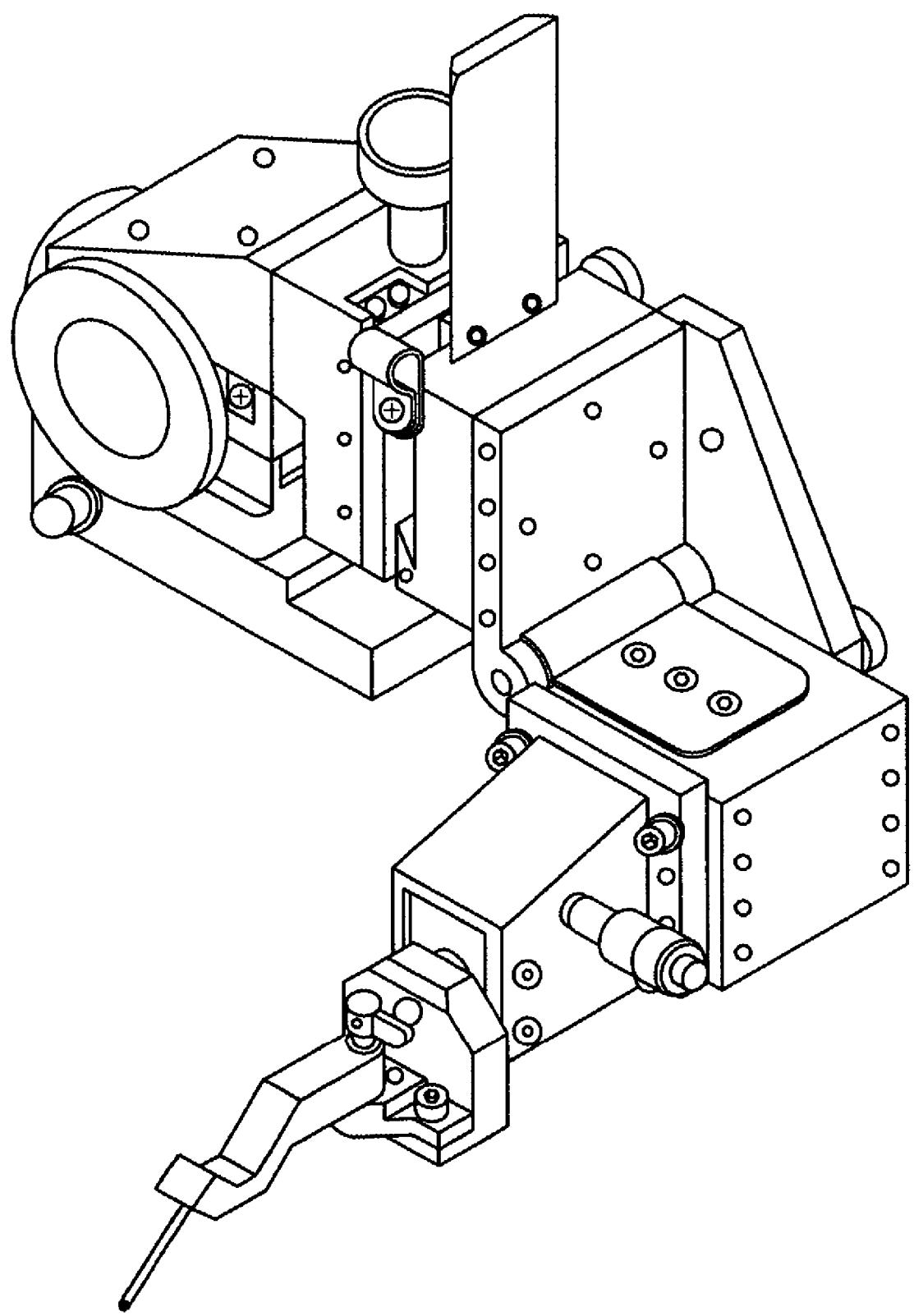
Figure 10C:
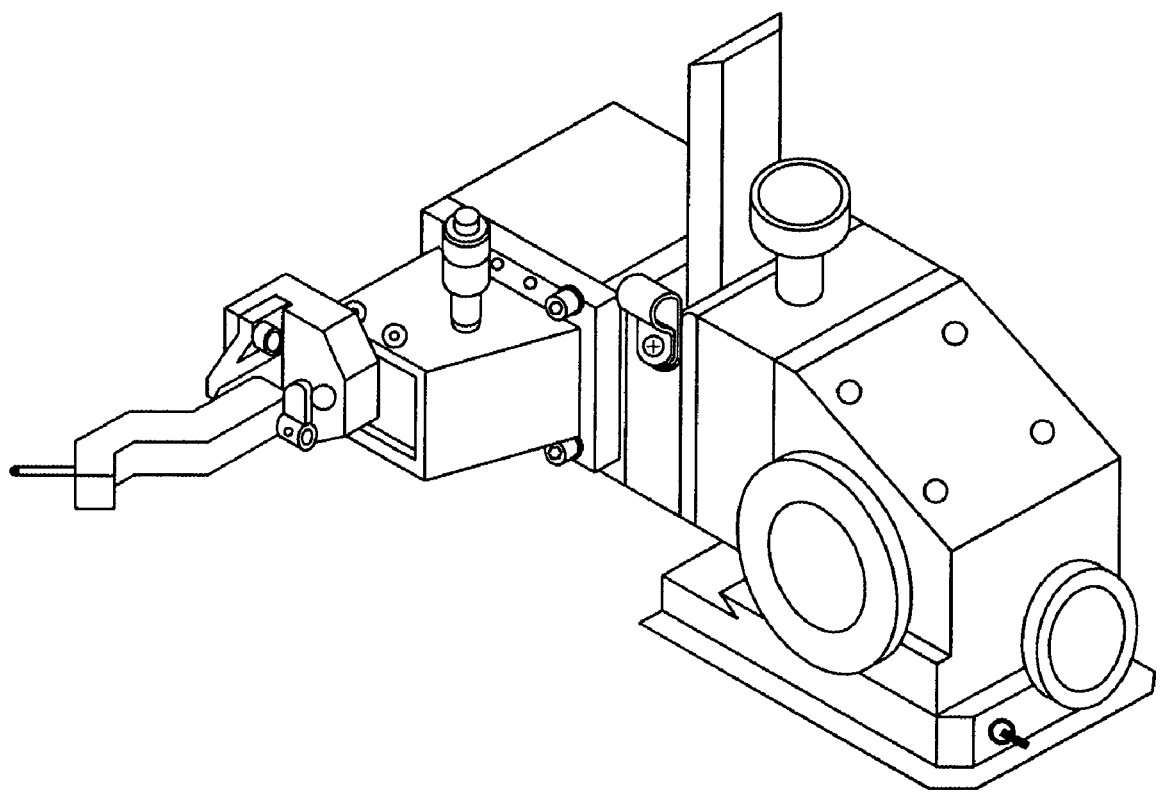
Figure 10D:
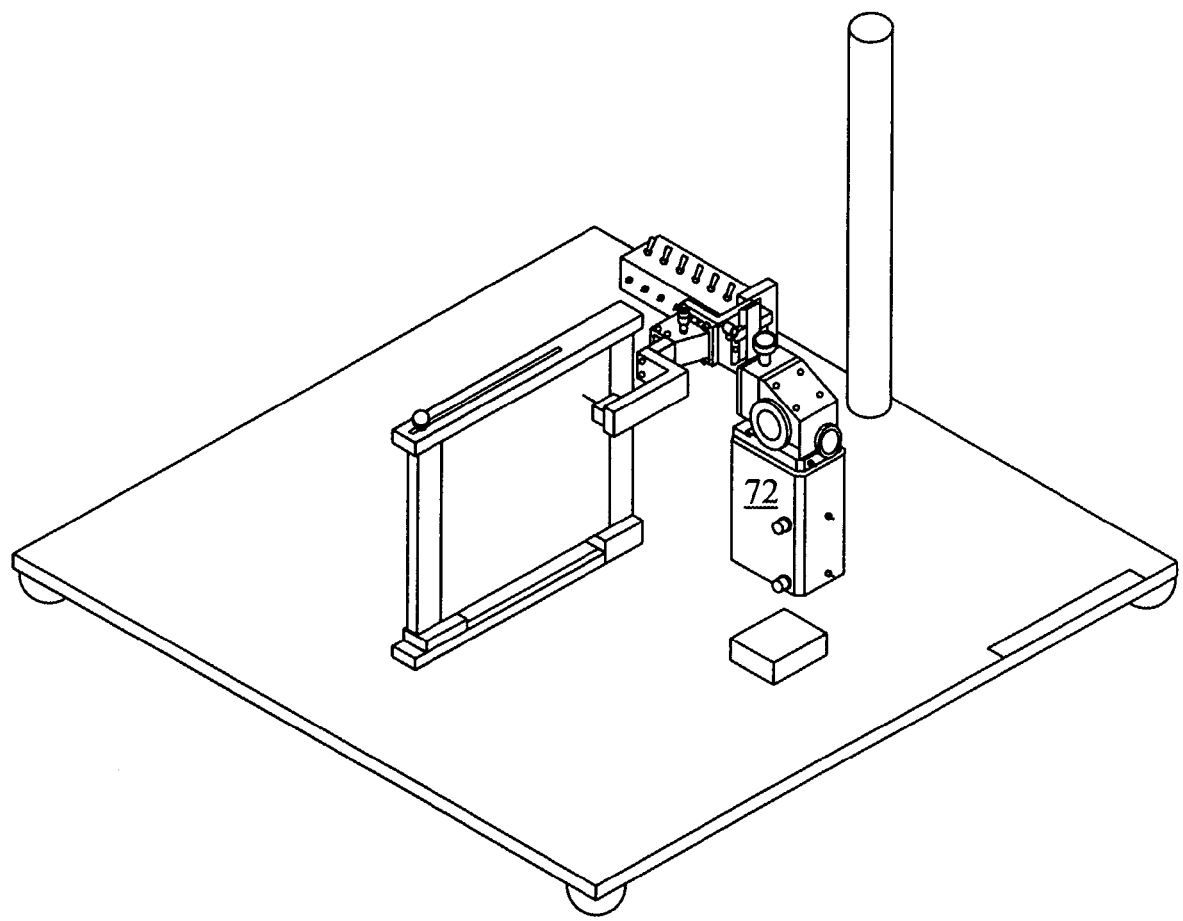
Figure 10E:
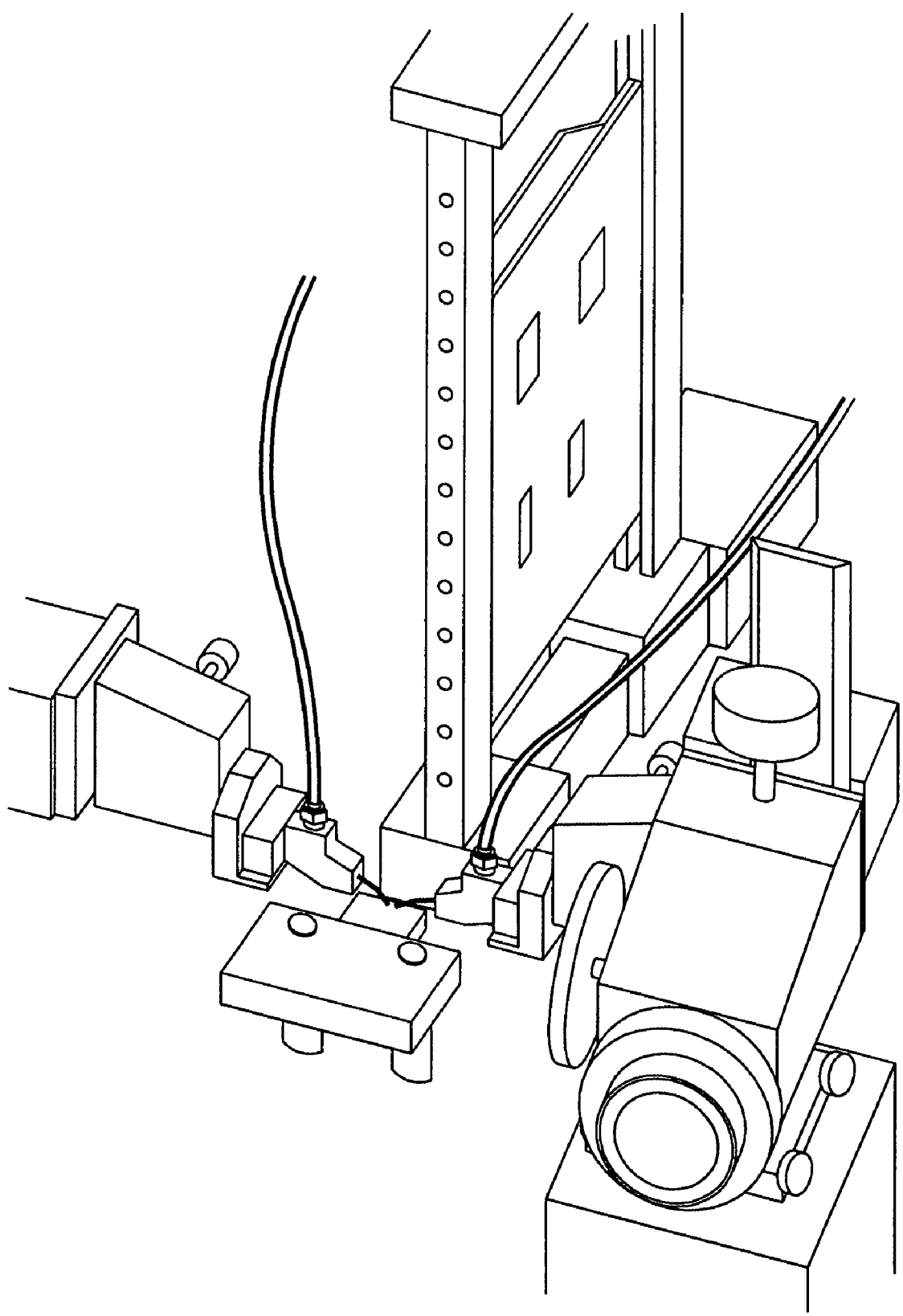
Figure 10F:
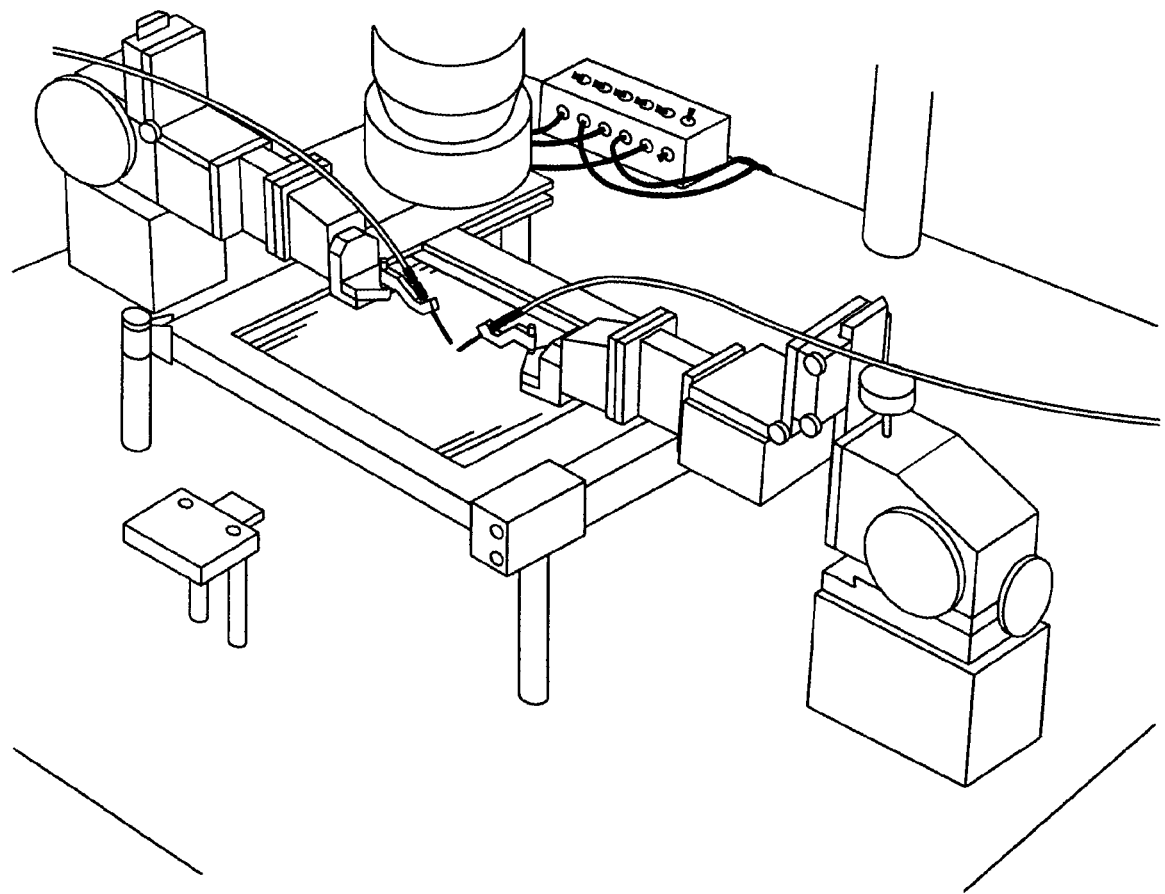
Figure 10G:
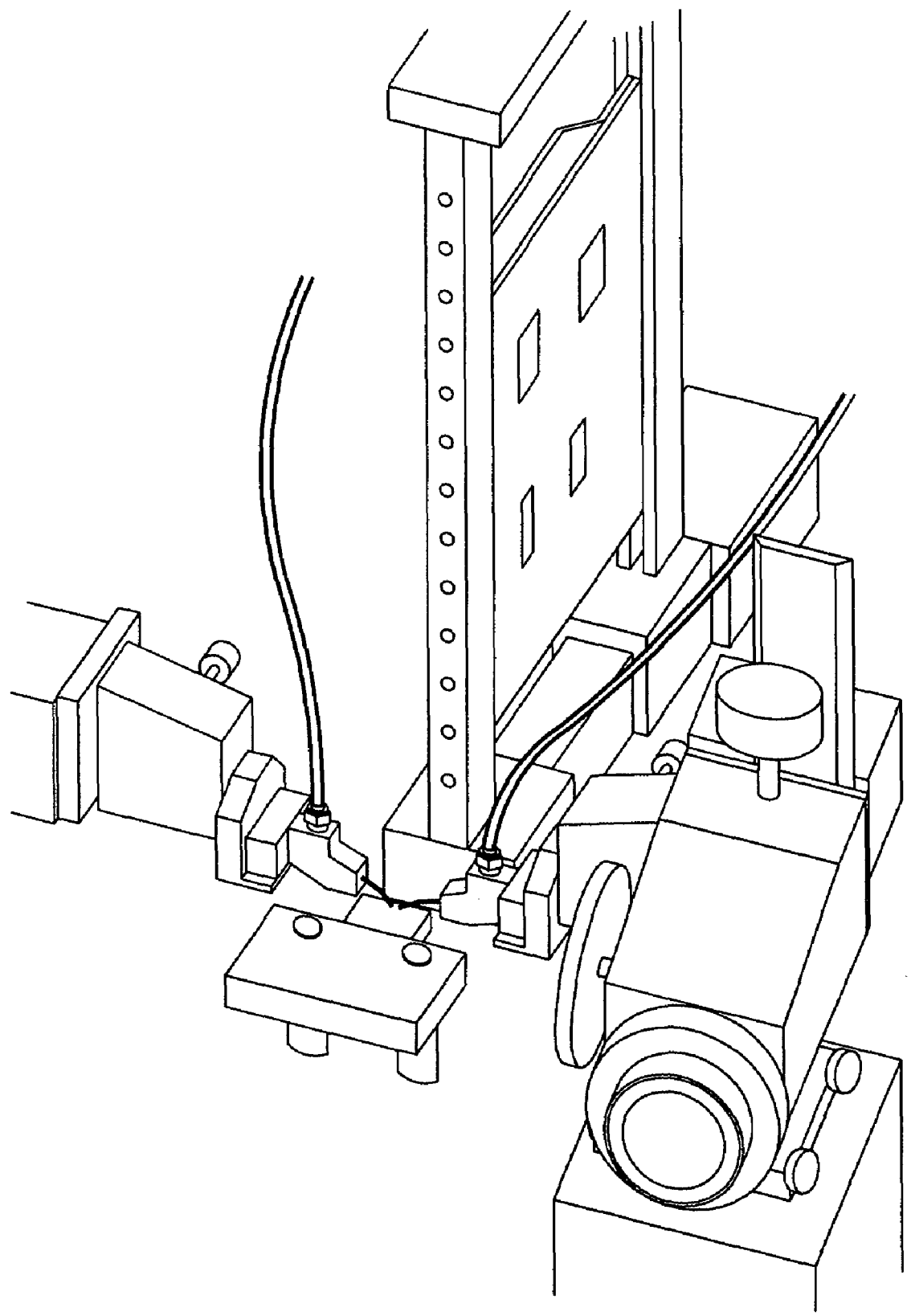
Figure 10H:
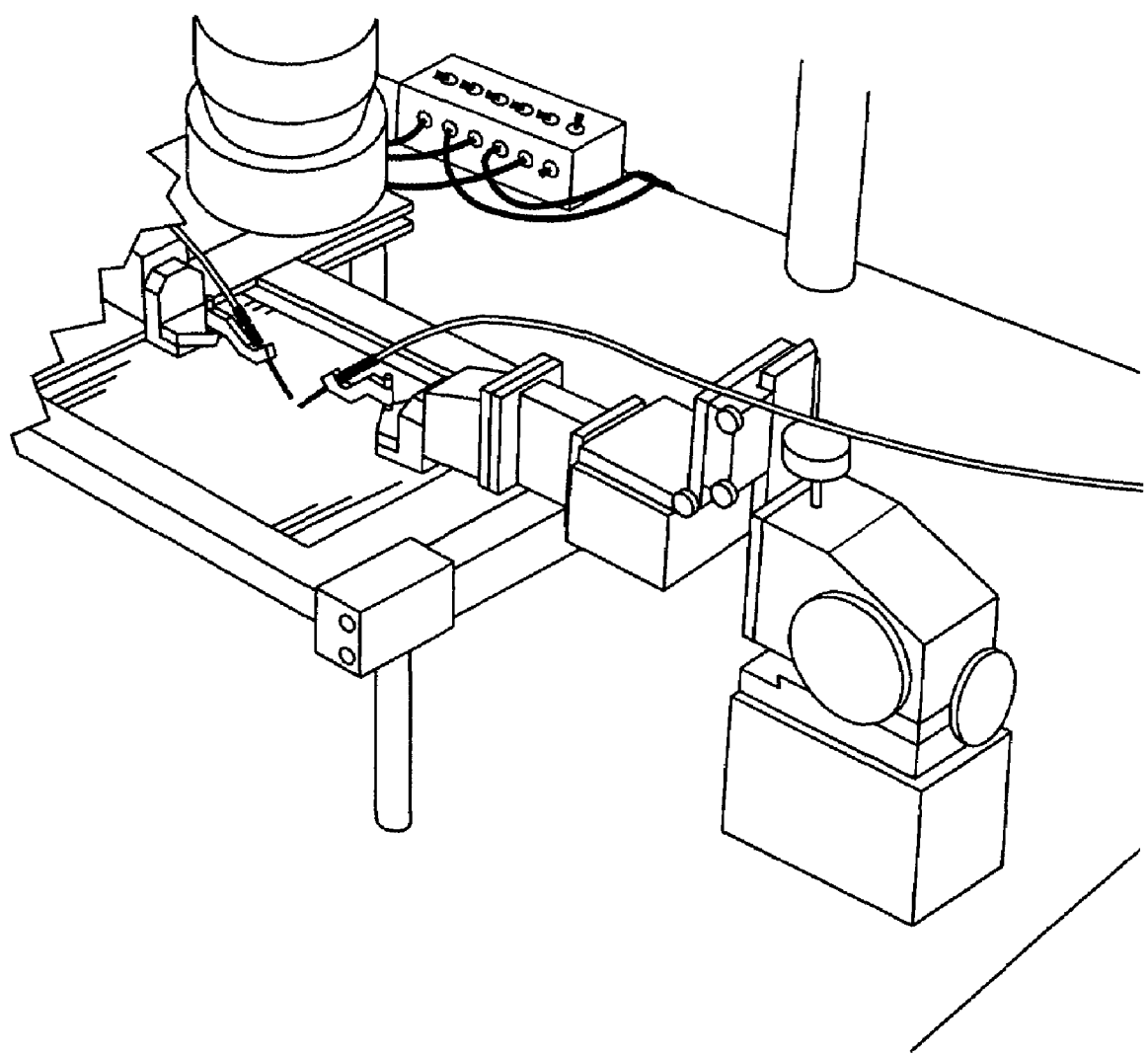
Figure 10I:
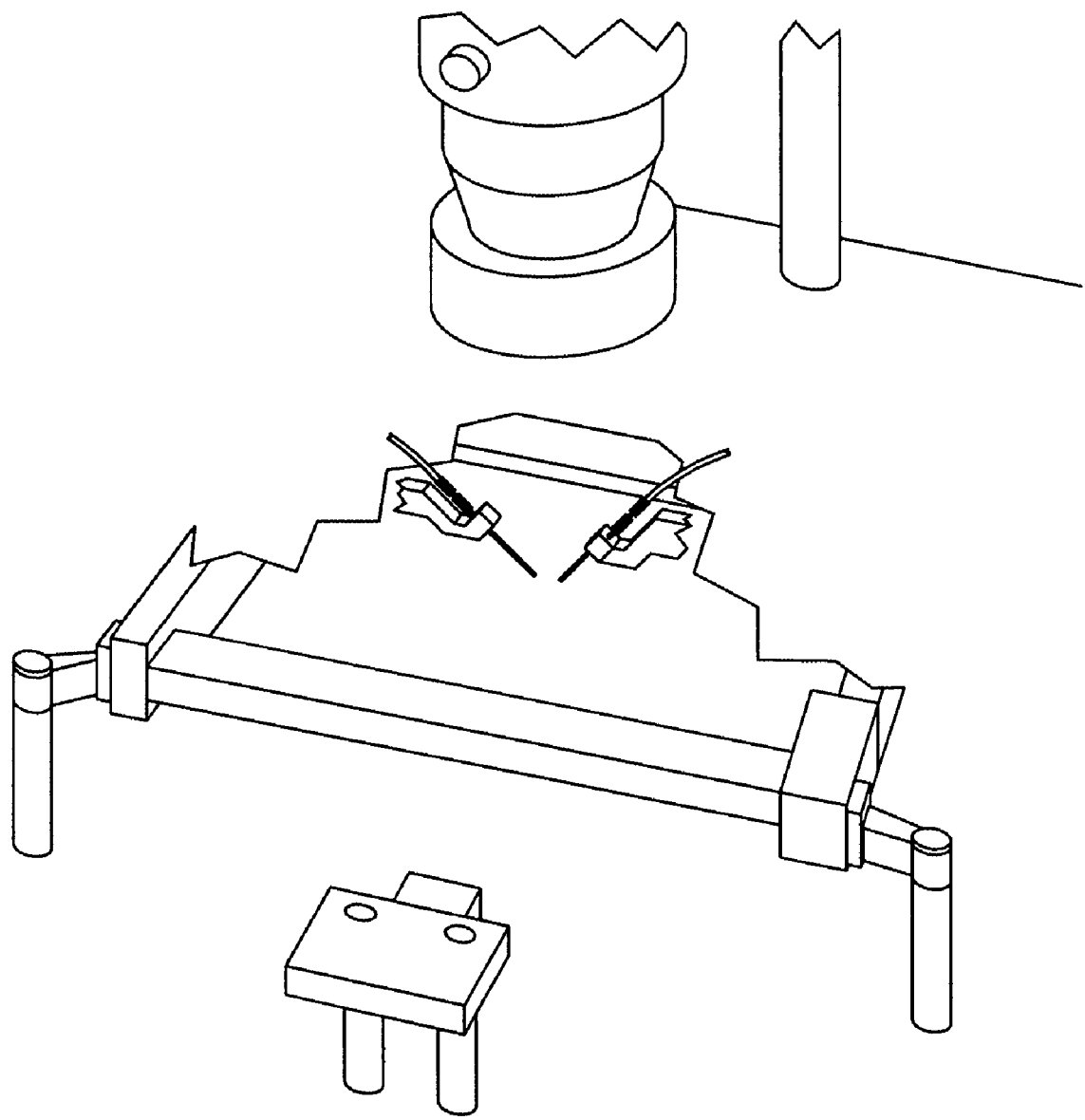
Figure 10J:
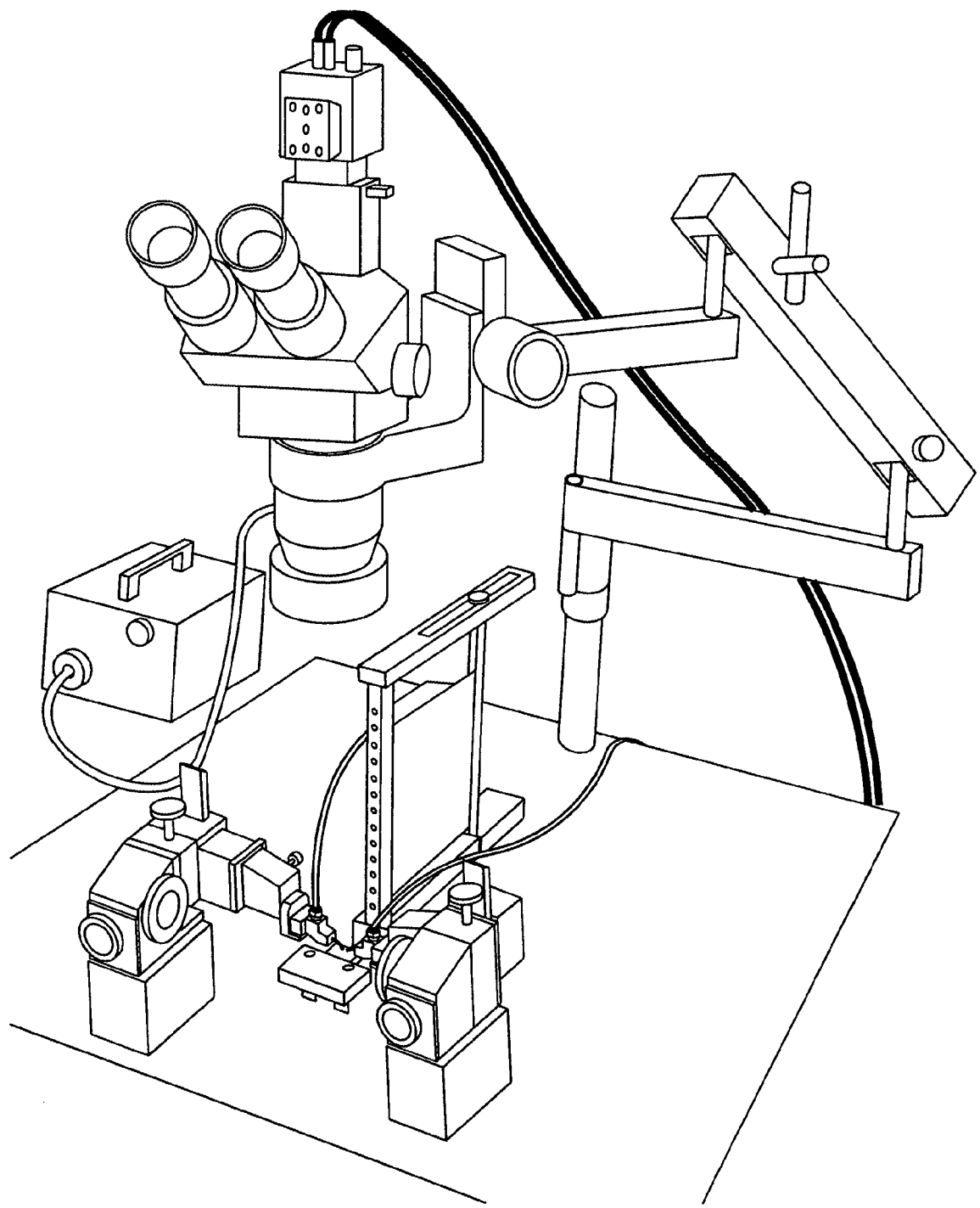
Figure 10K:
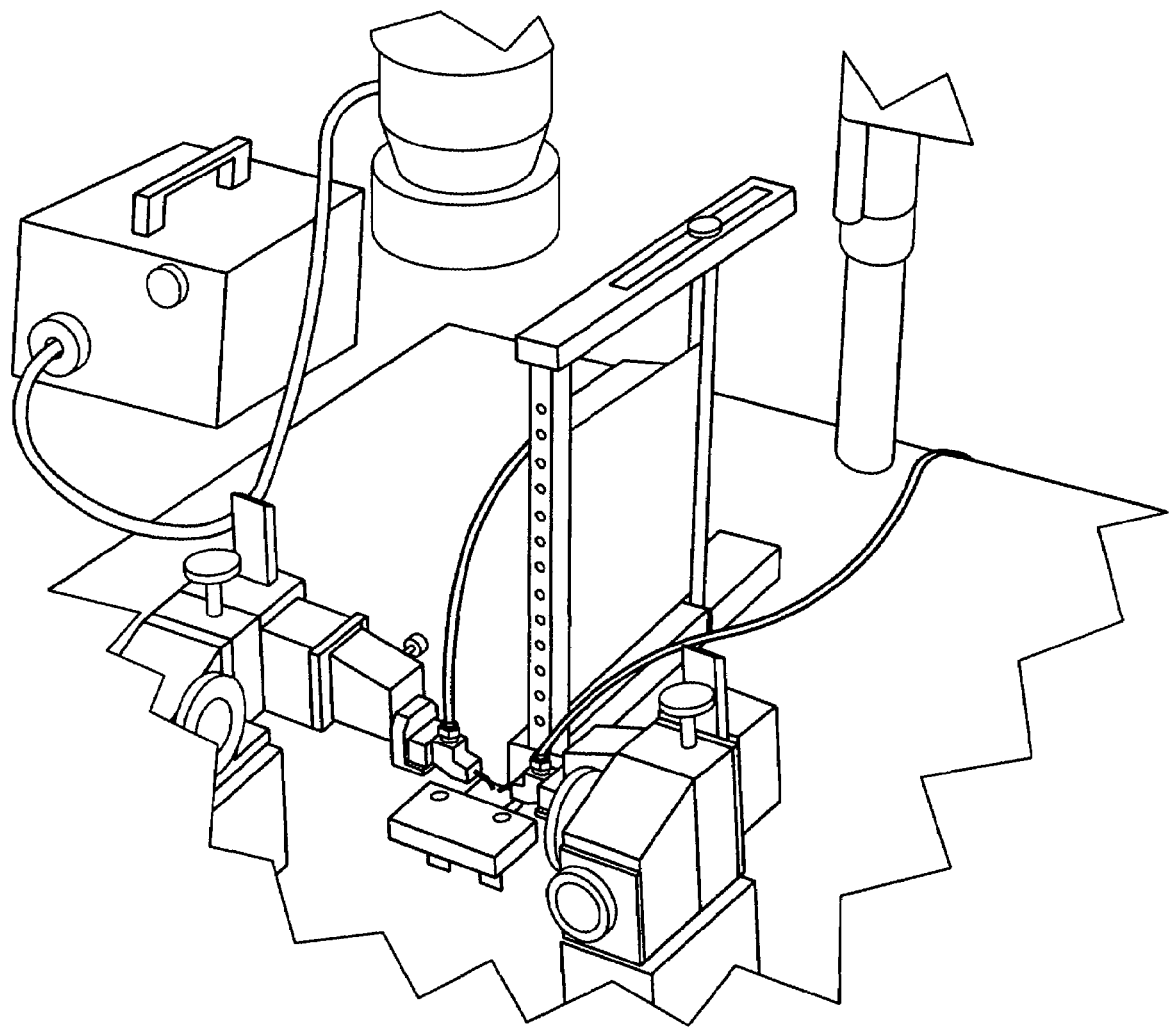
Figure 10L:
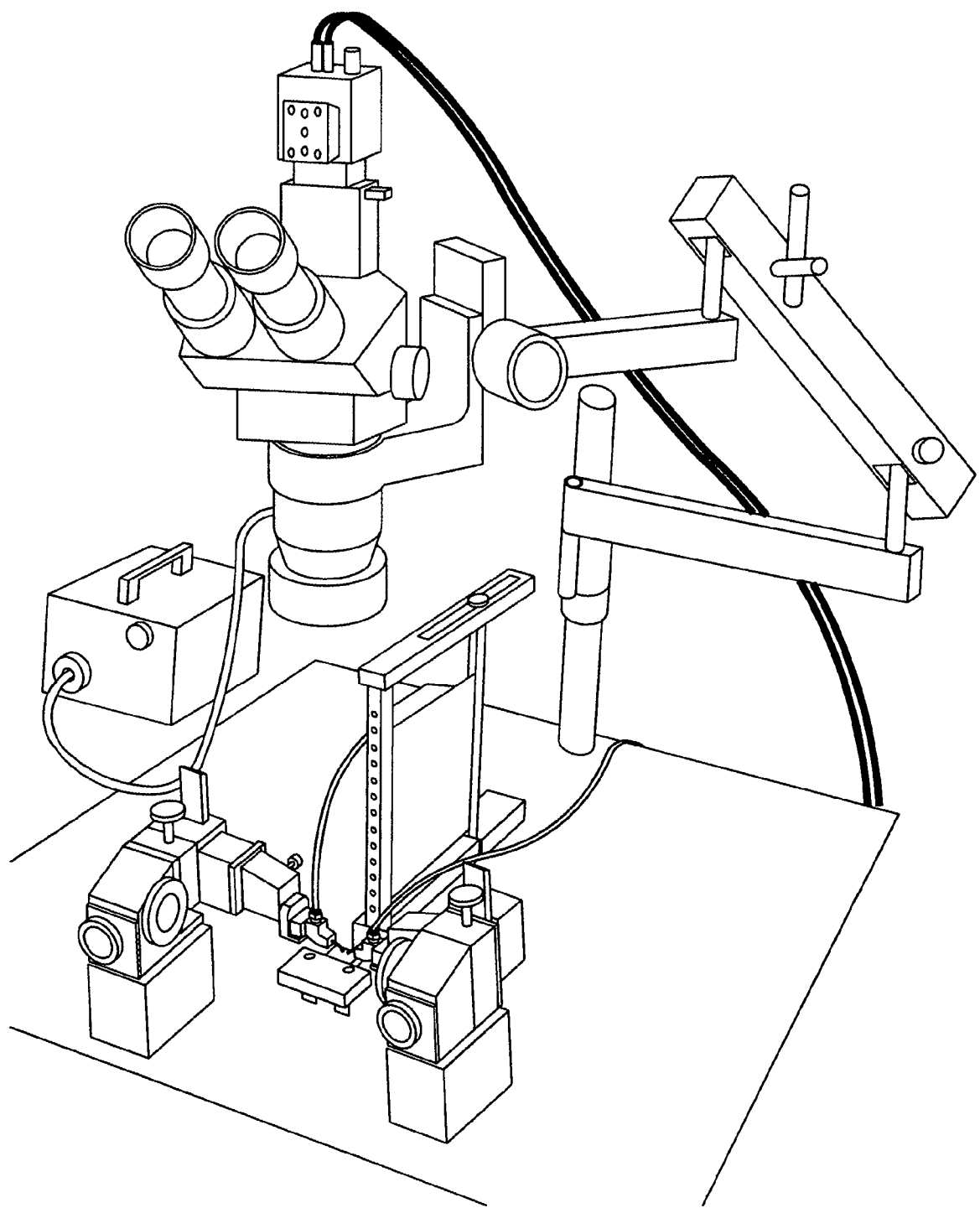
Figure 10M:
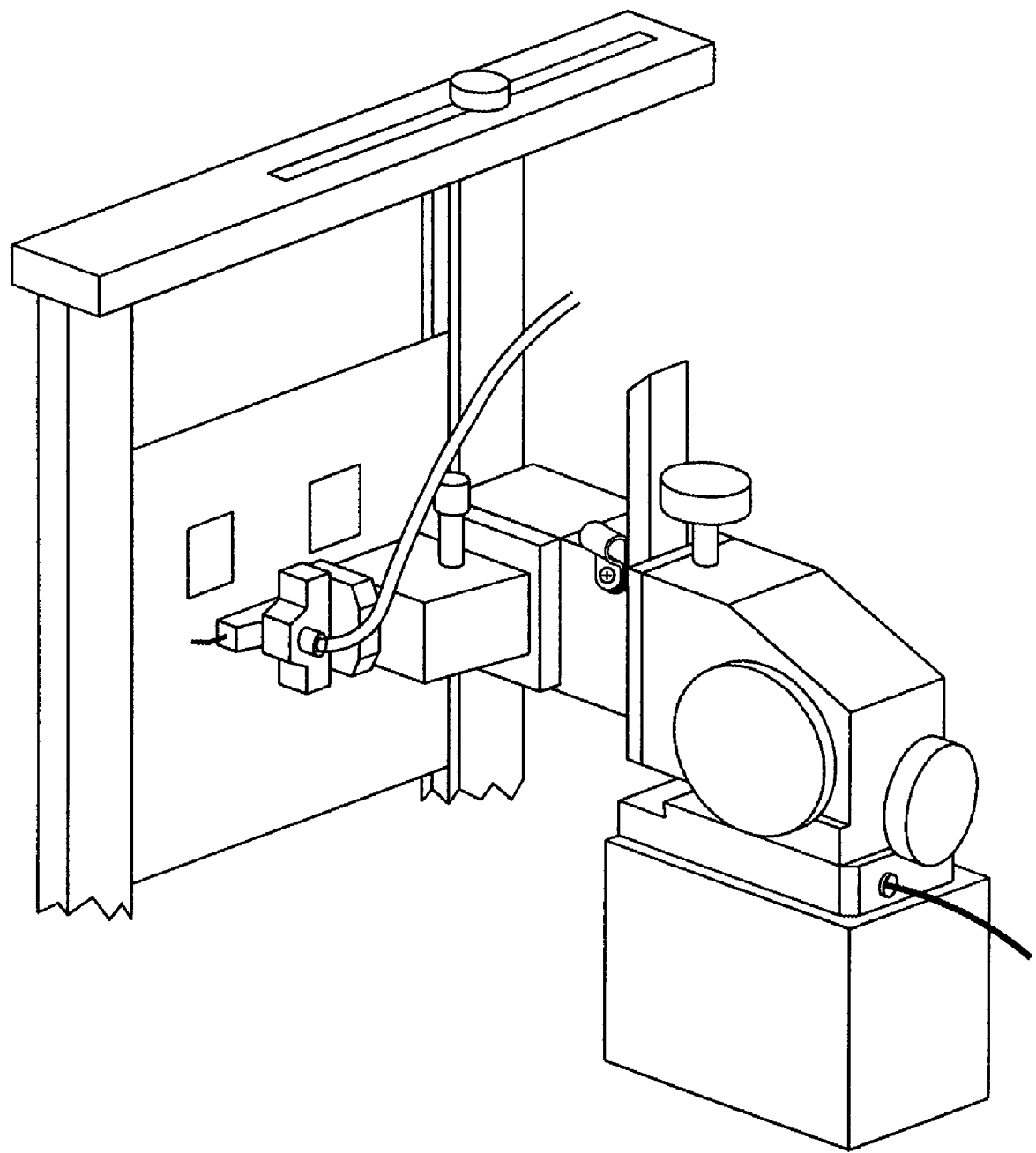
Figure 10N:
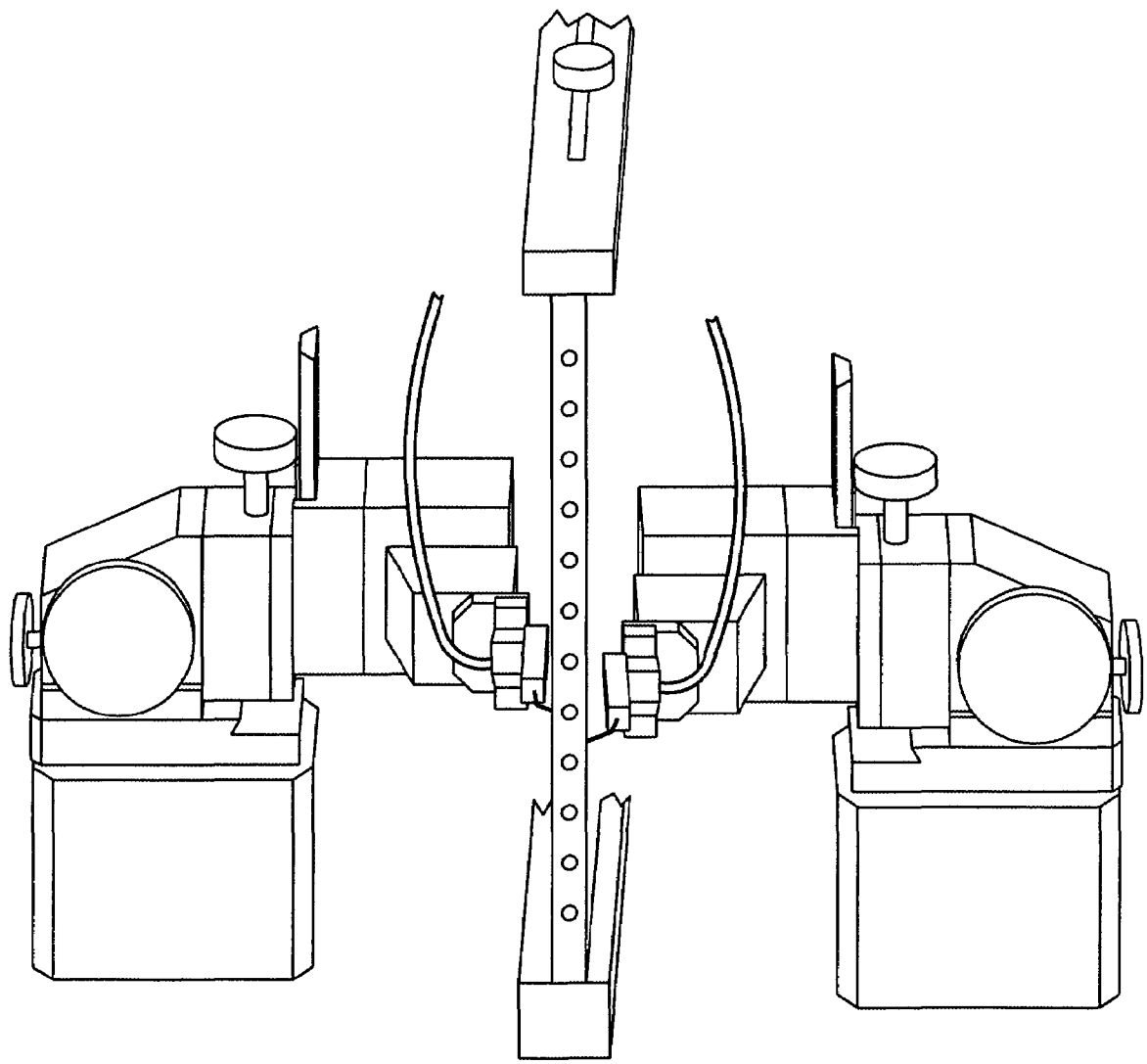
Figure 10O:
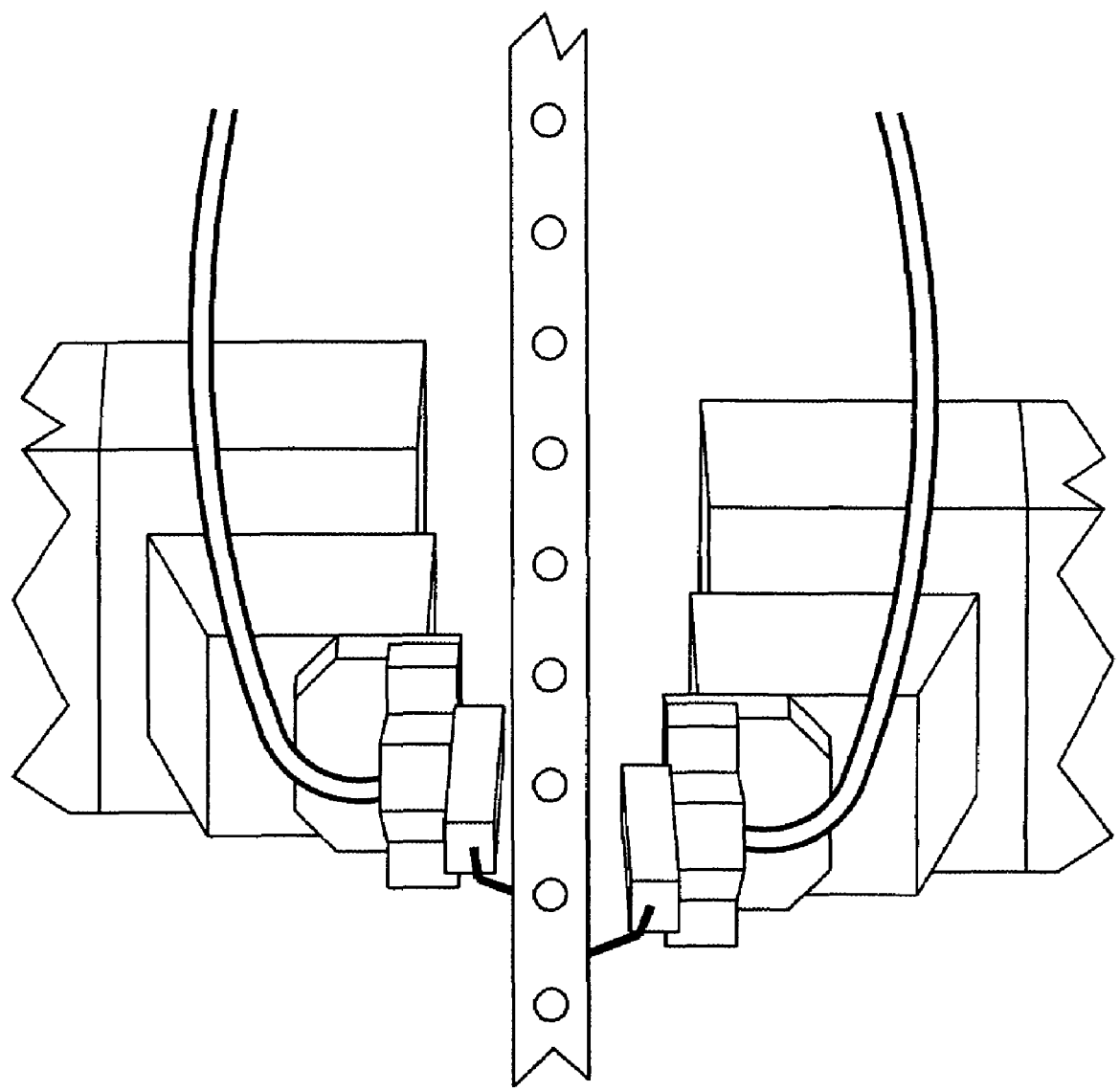
Figure 10P:
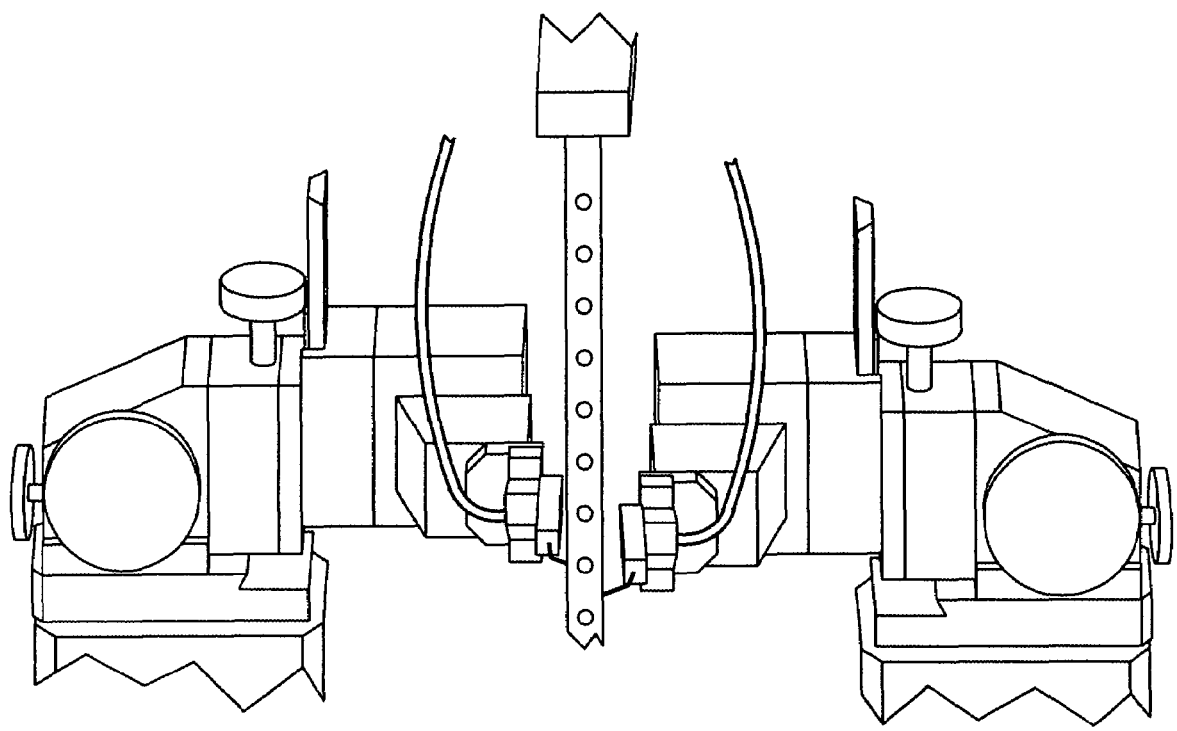
Figure 10Q:
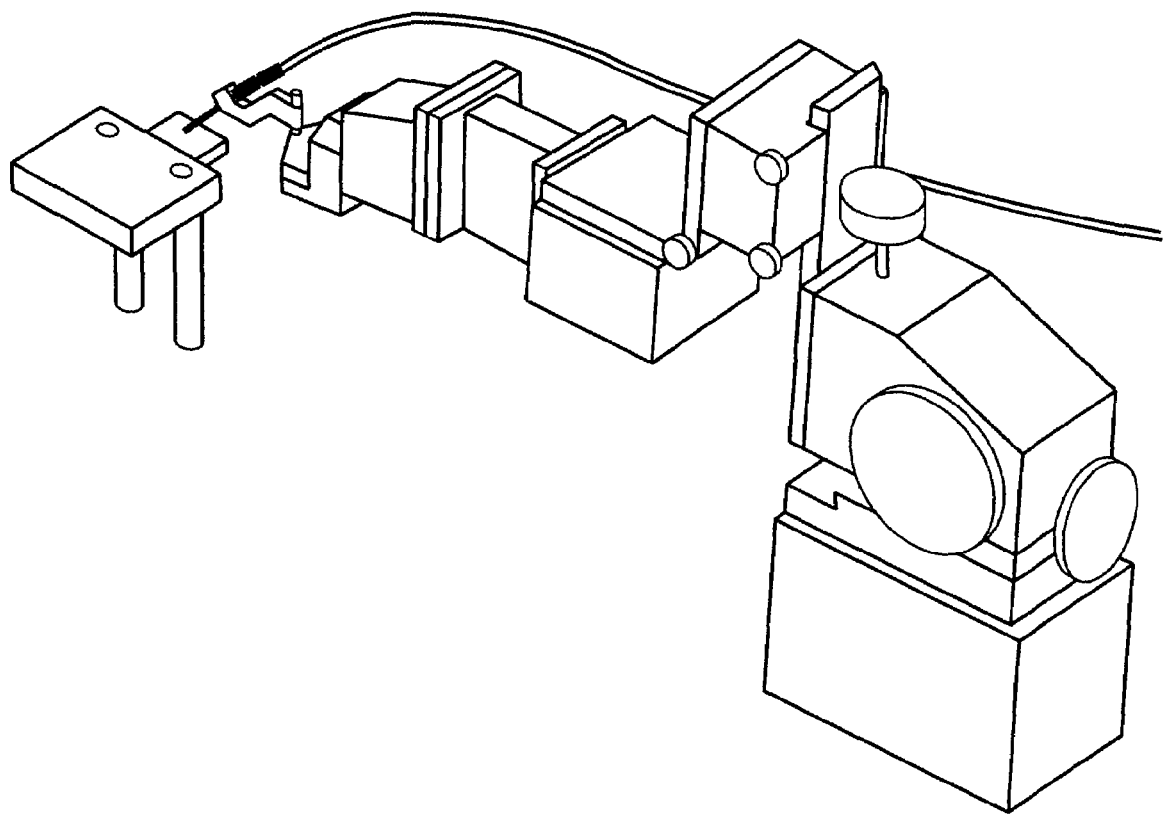
Figure 10R:
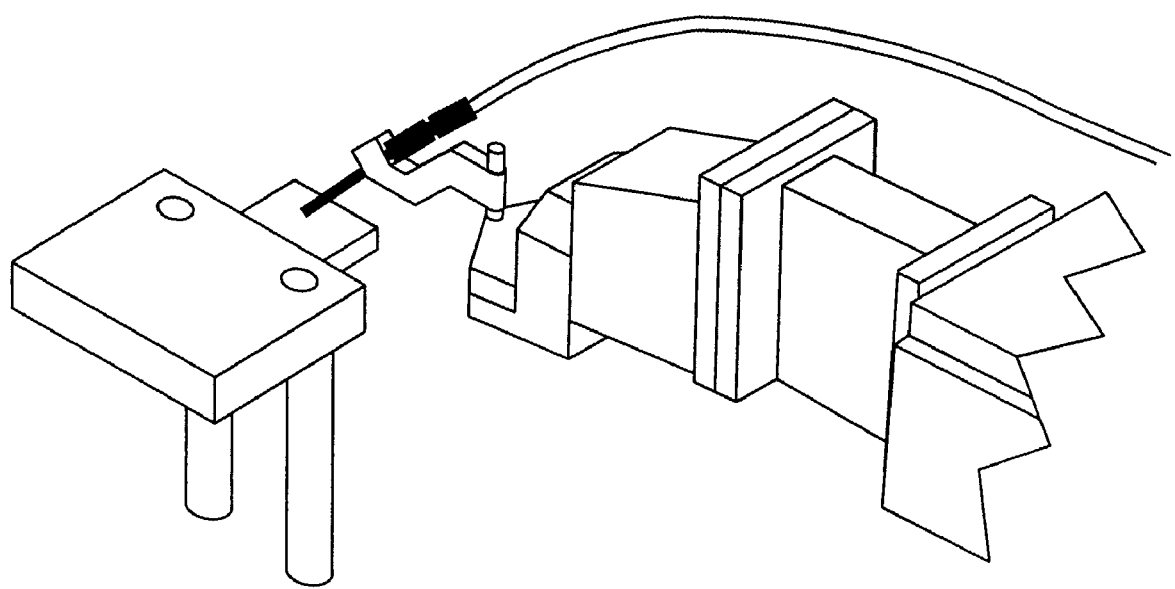
Figure 10S:
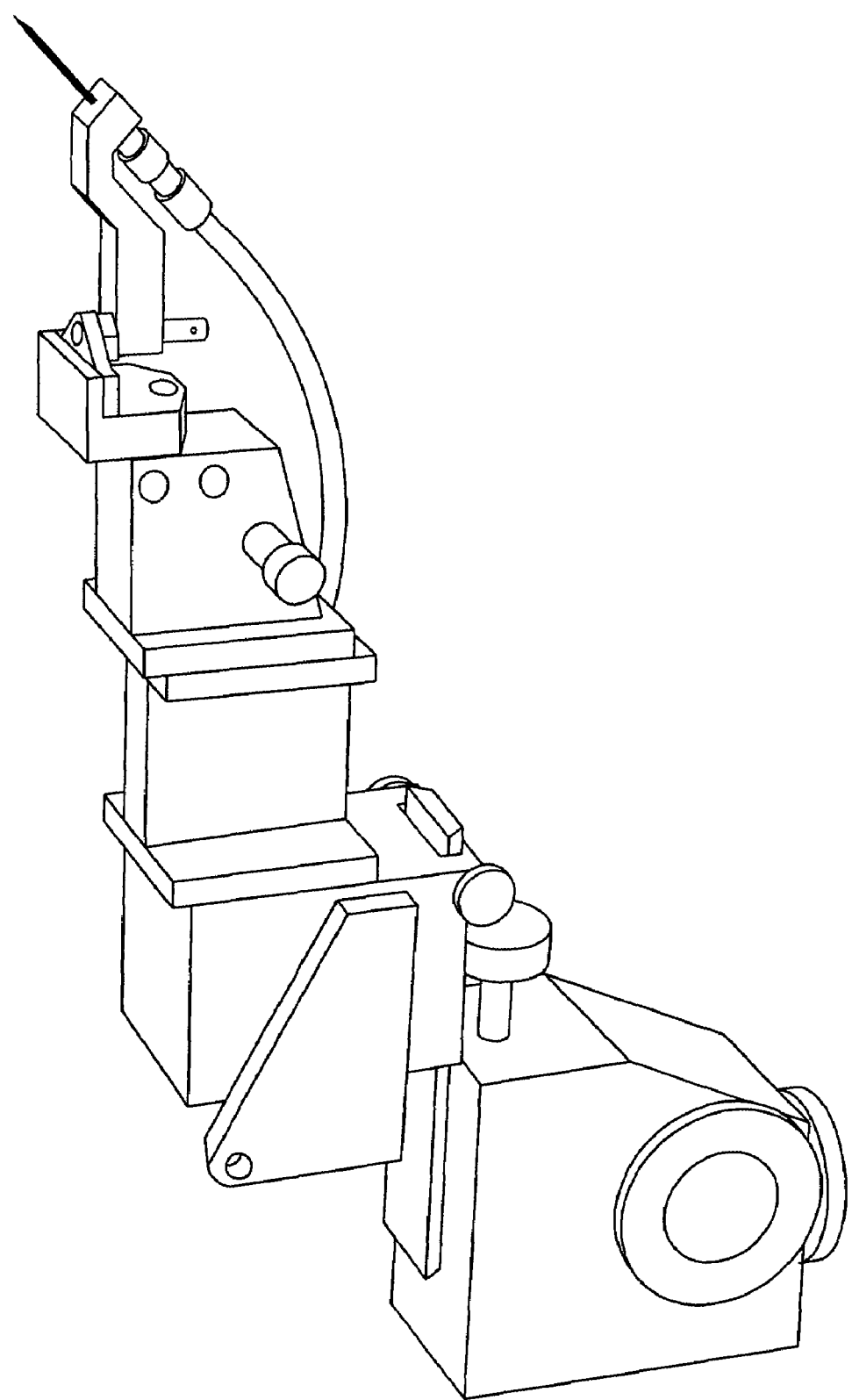
Figure 10T:
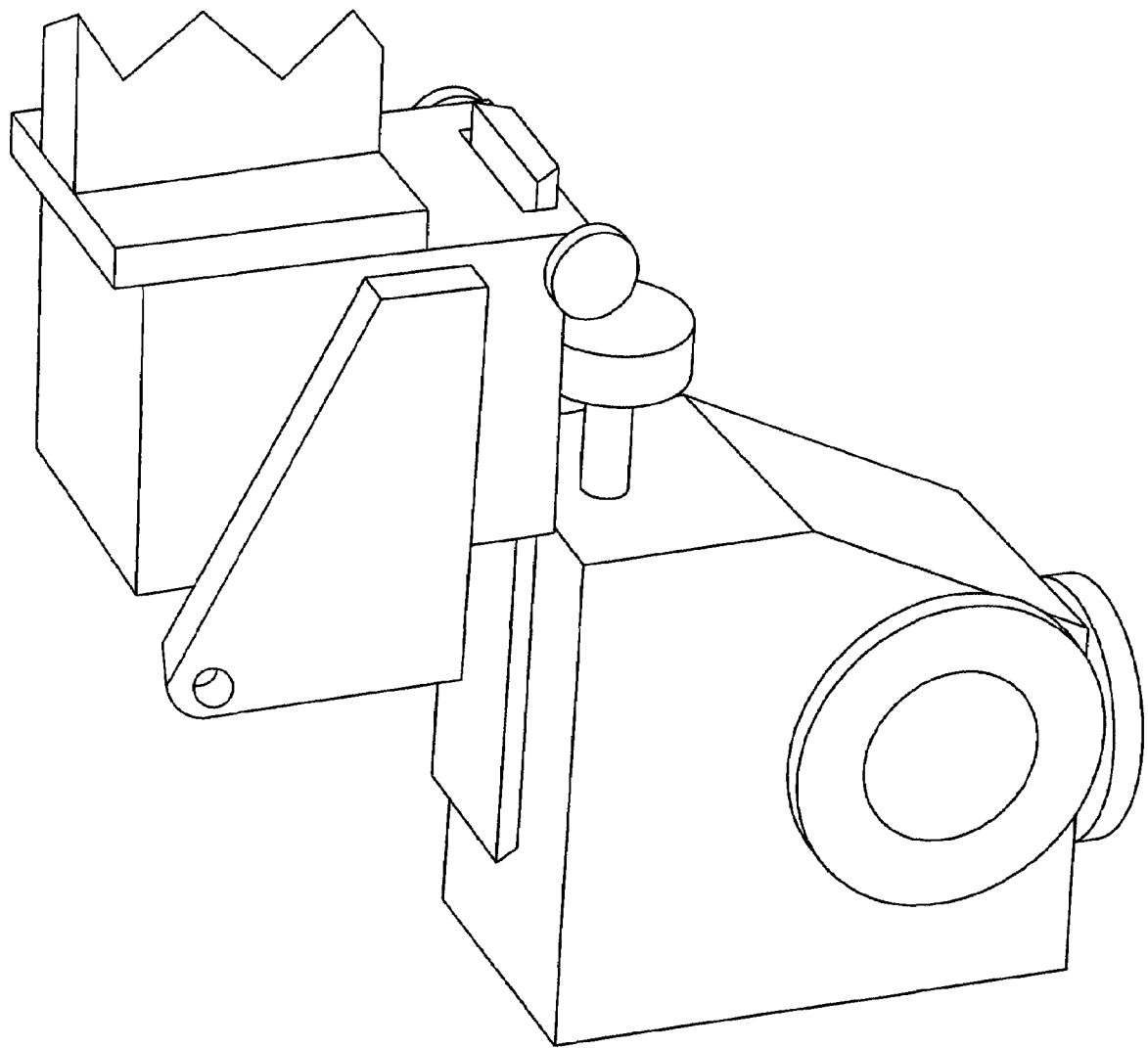
Figure 10U:
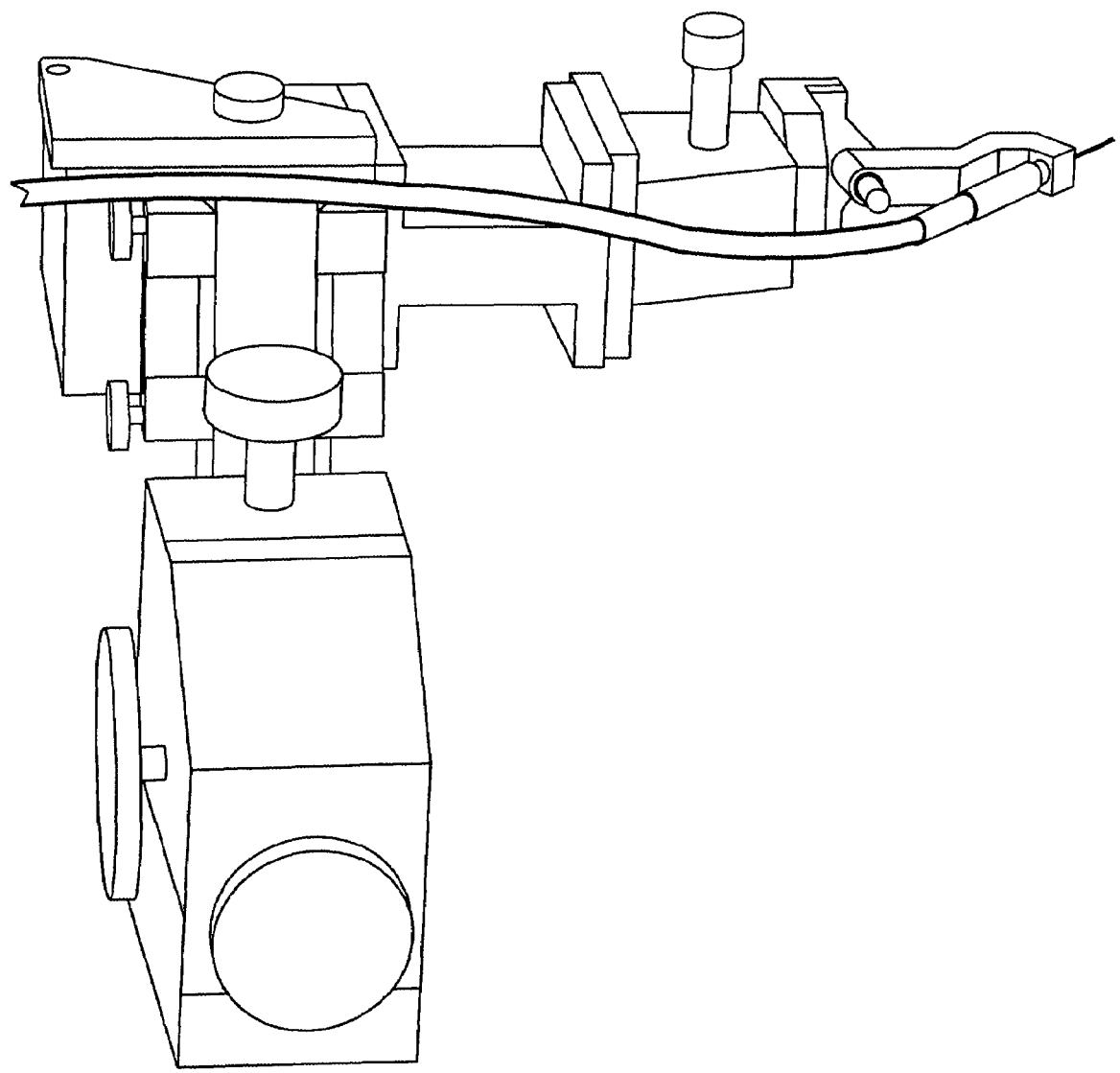
Figure 10V:
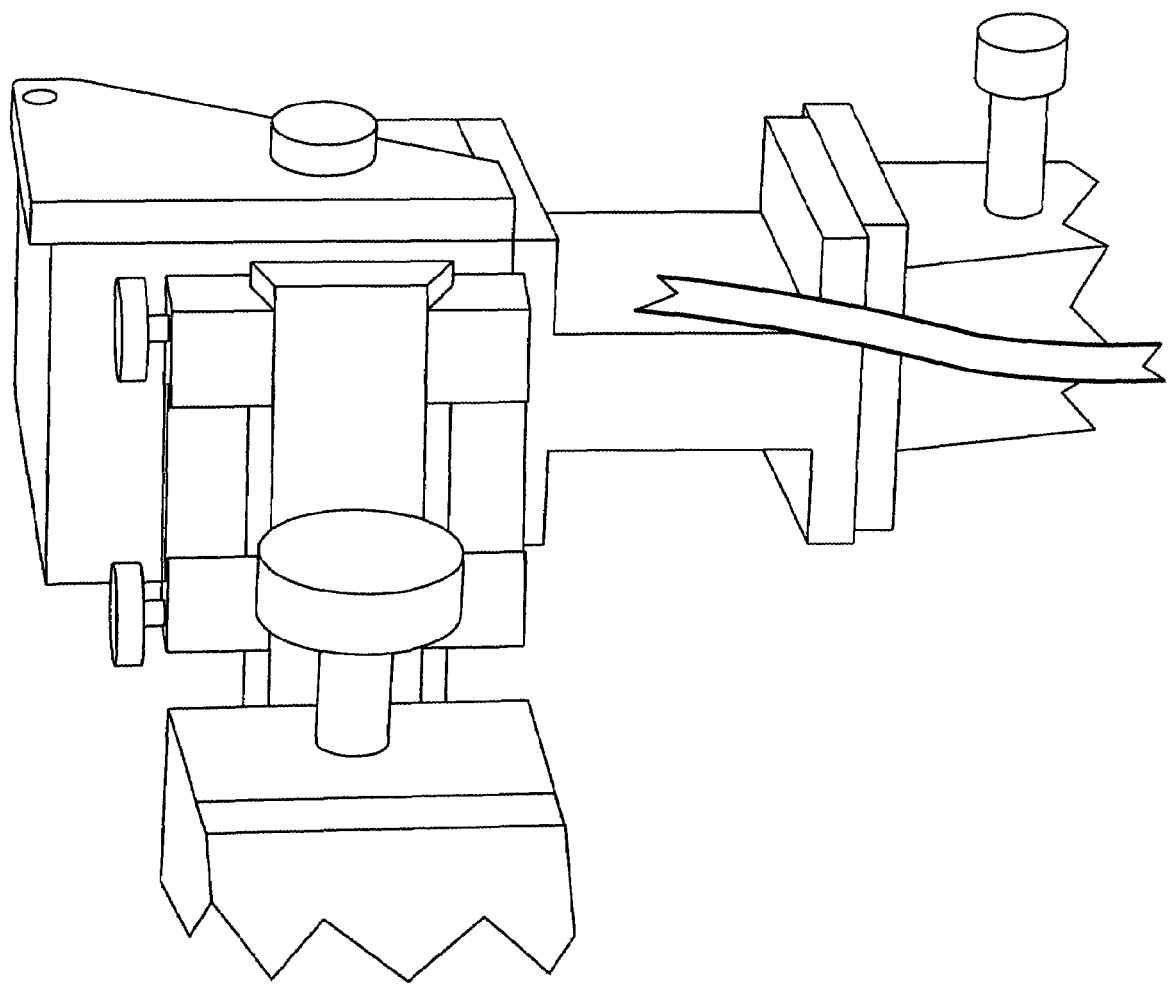
Figure 10W:
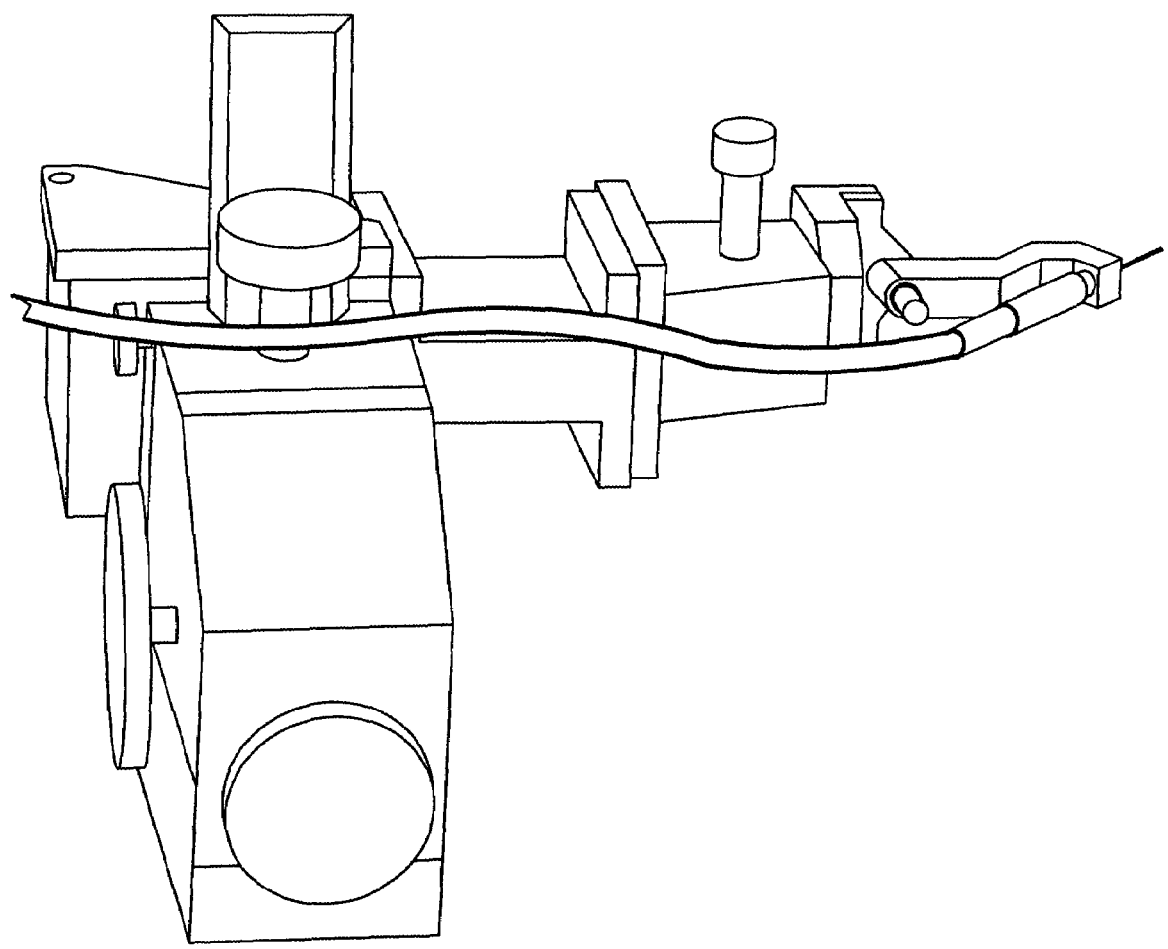
Figure 10X:
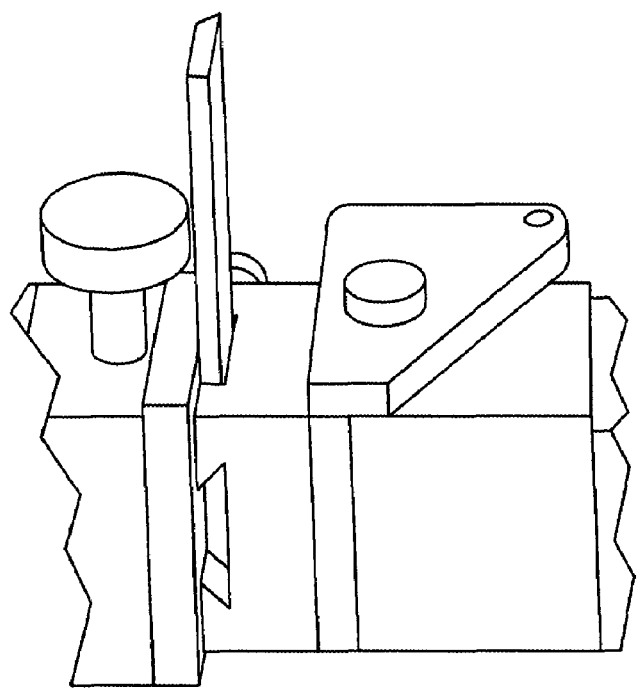
Figure 10Y:
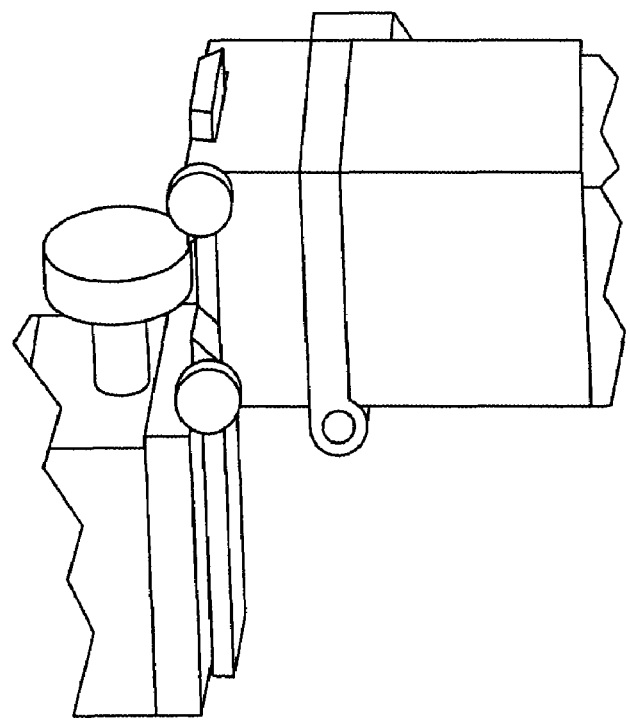
Figure 10Z:
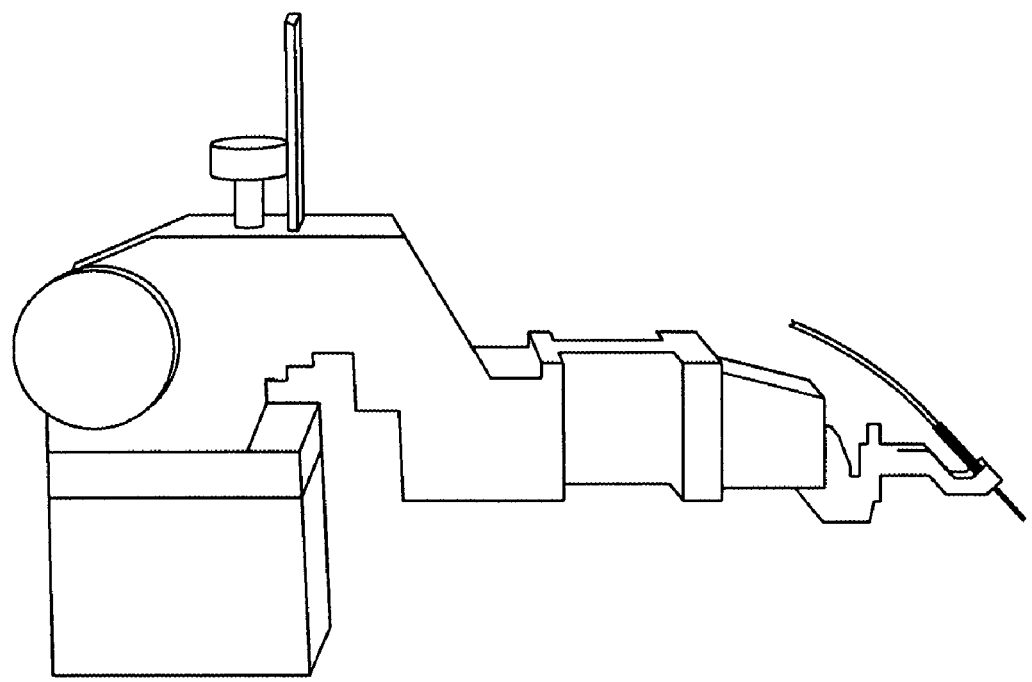
Figure 10A:
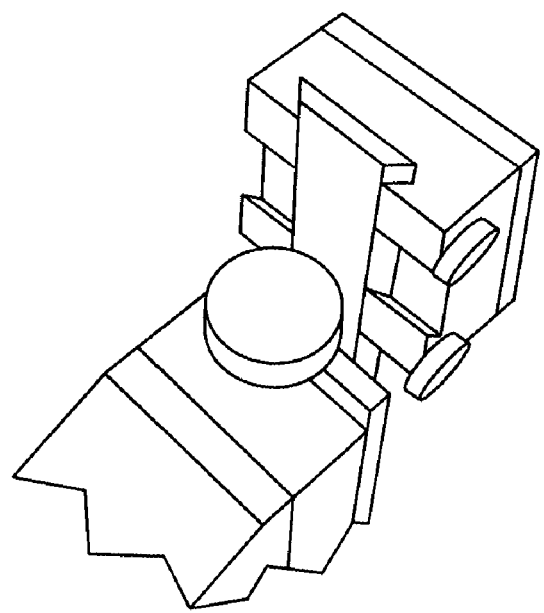
Figure 10B:
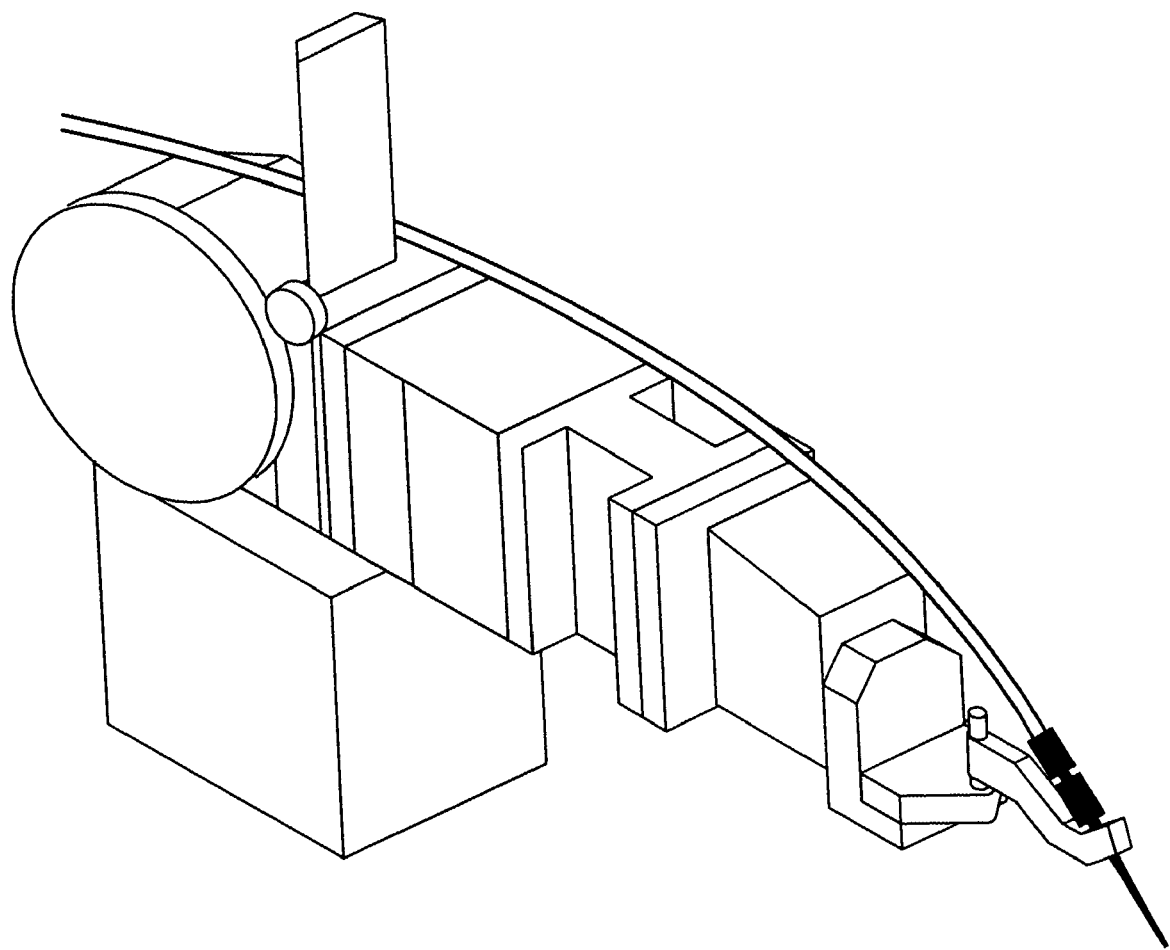
Figure 10C:
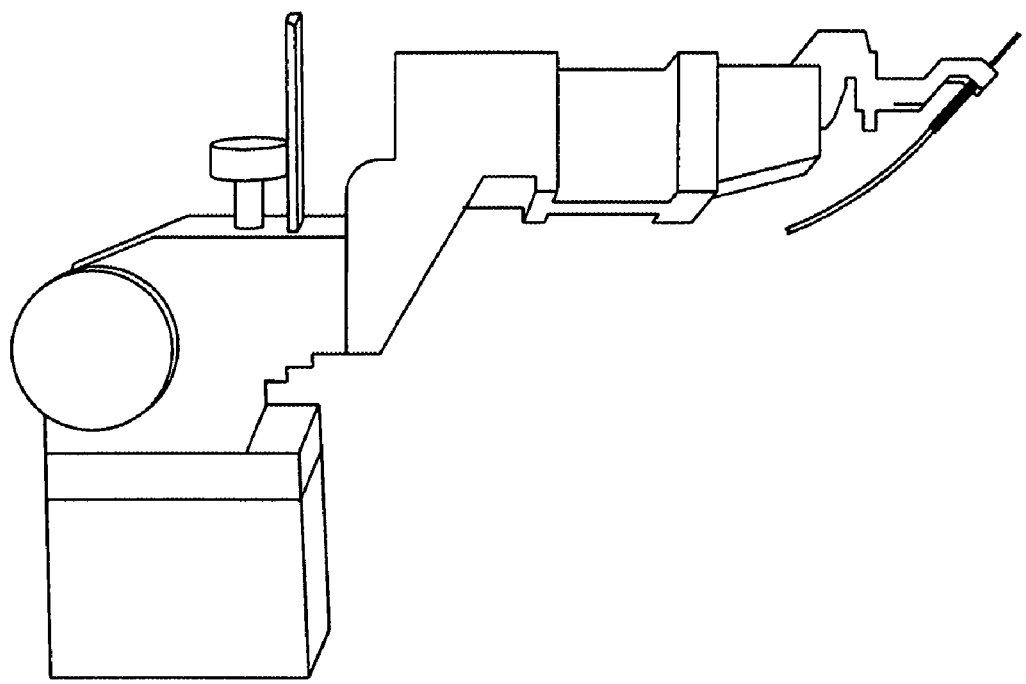
Figure 10D:
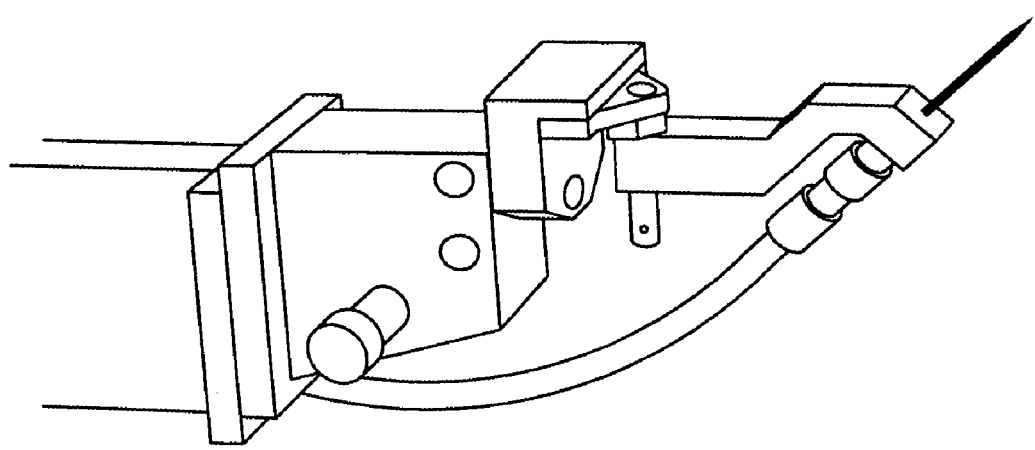
Figure 10E:
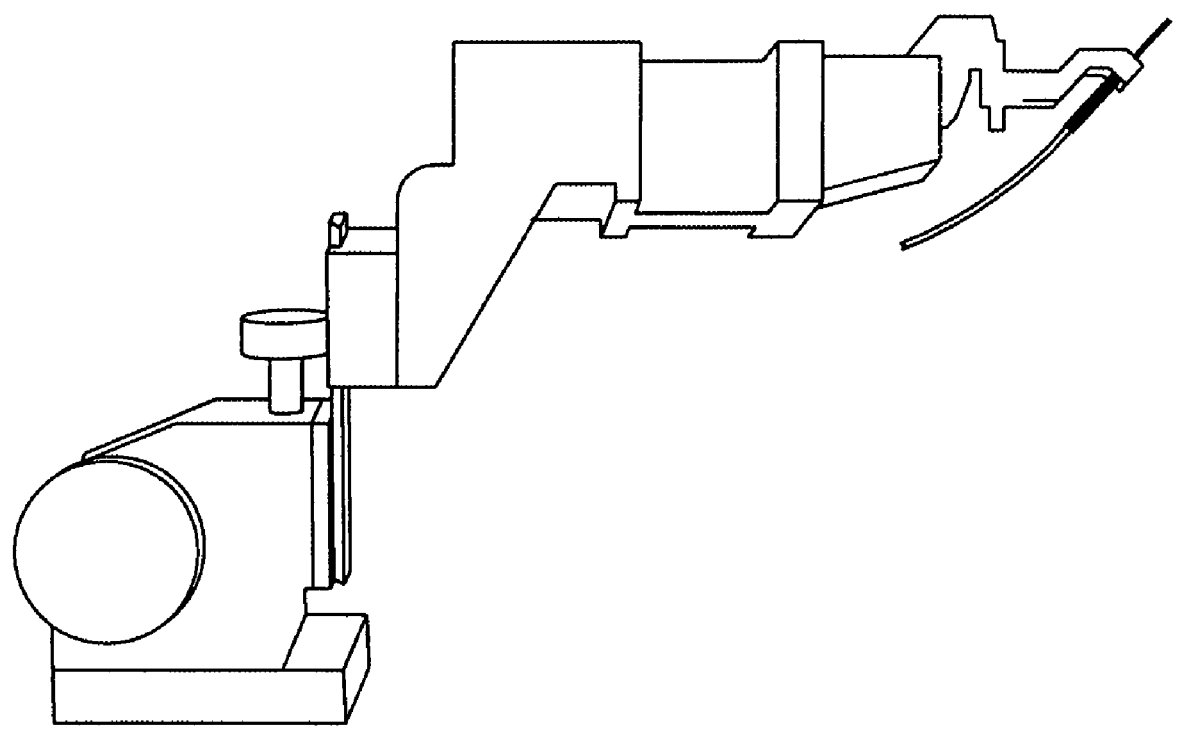
Figure 10F:
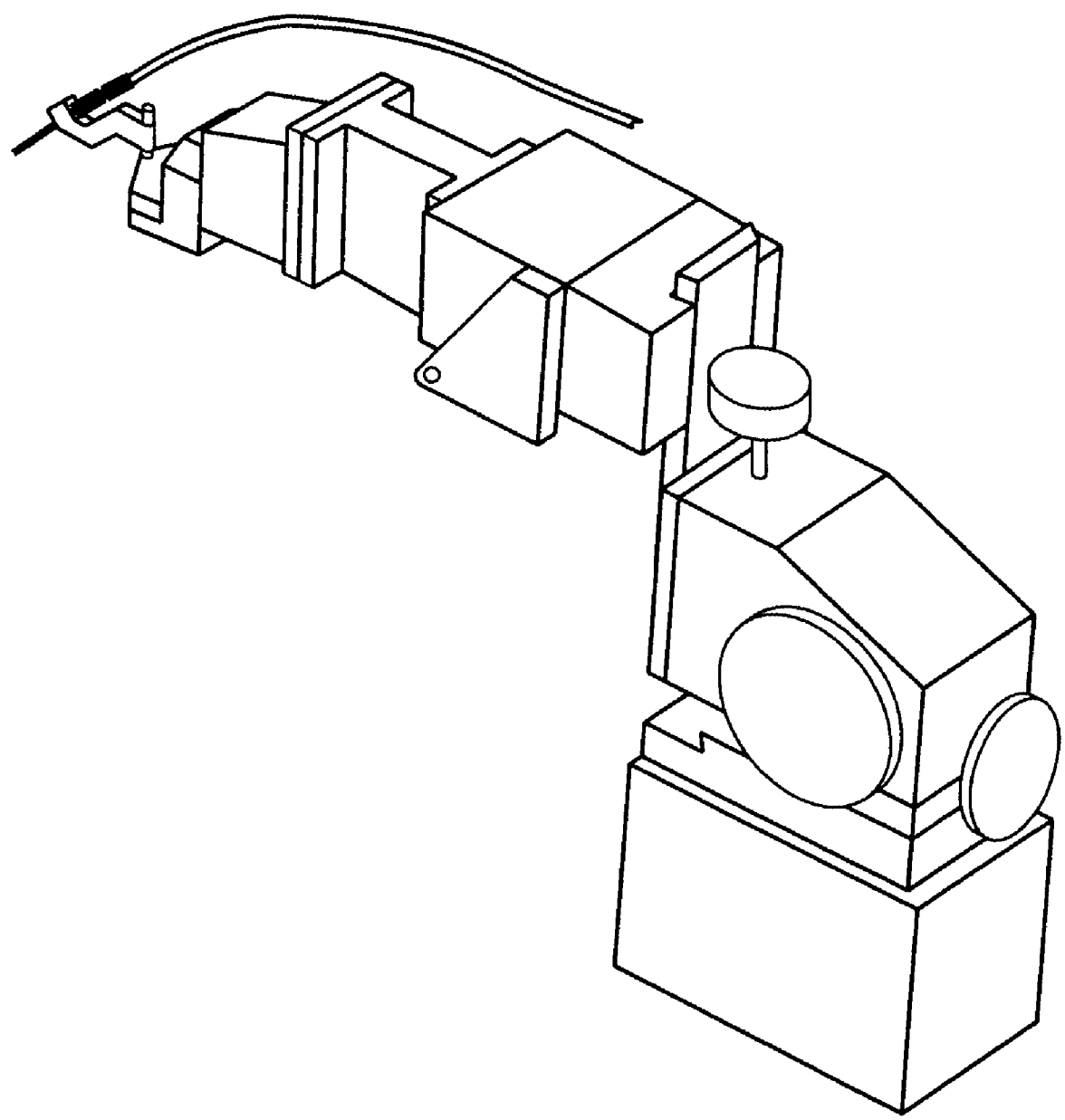
Figure 10G:
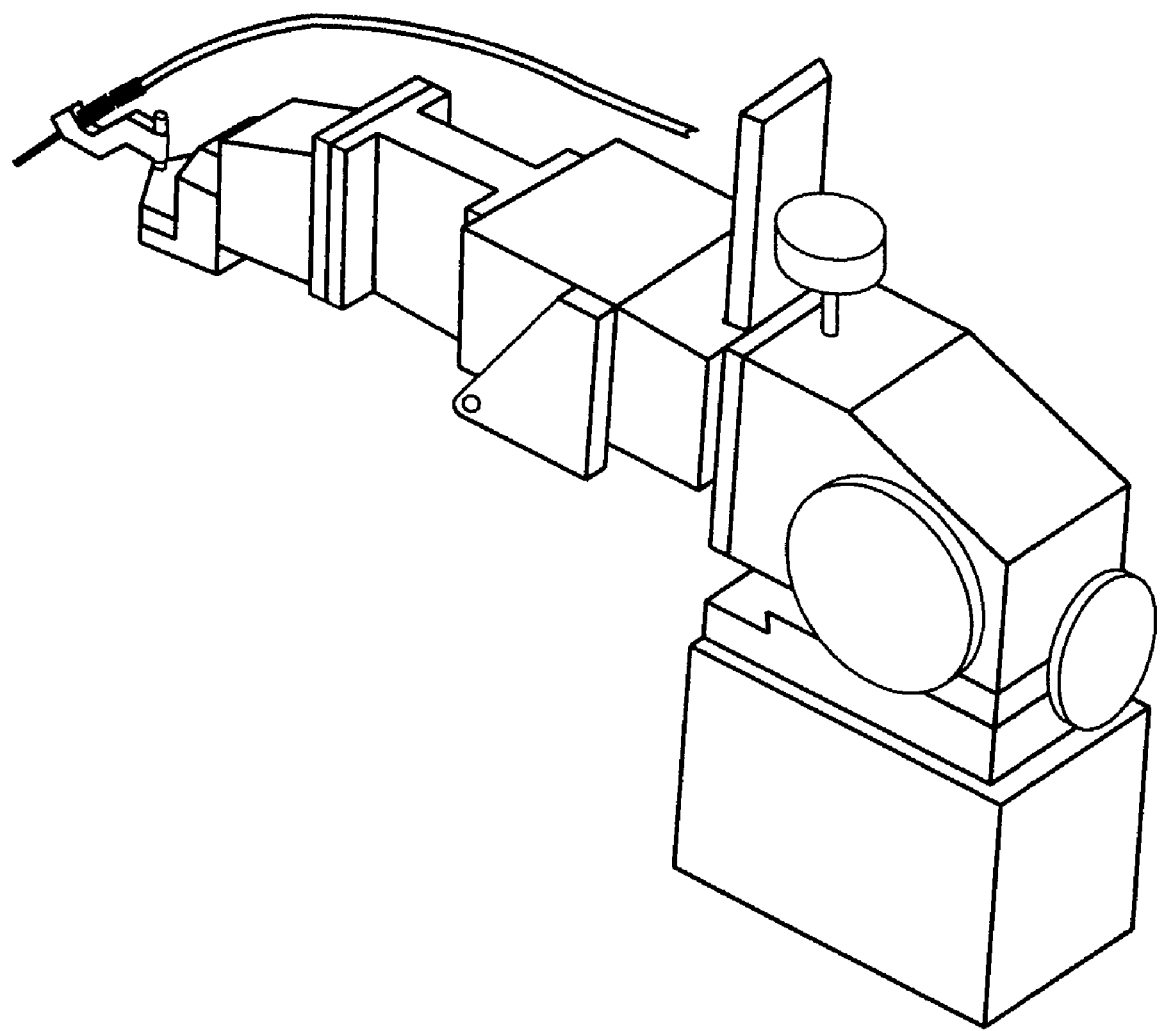
Figure 10H:
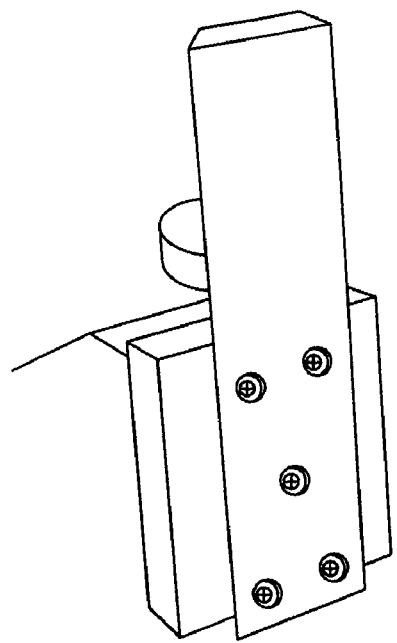
Figure 10I:
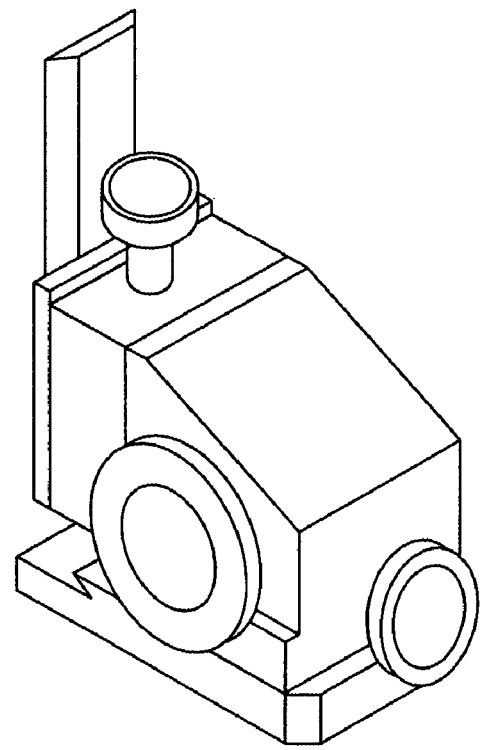
Figure 10J:
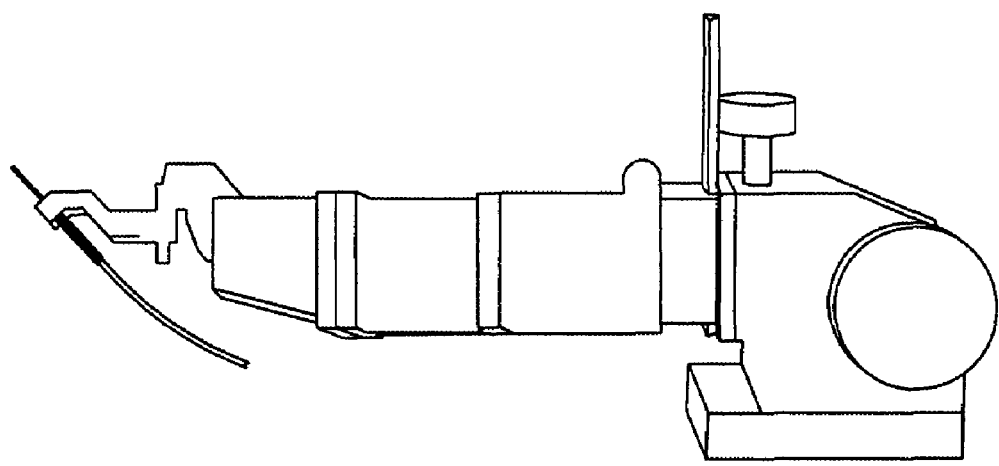
Figure 10K:
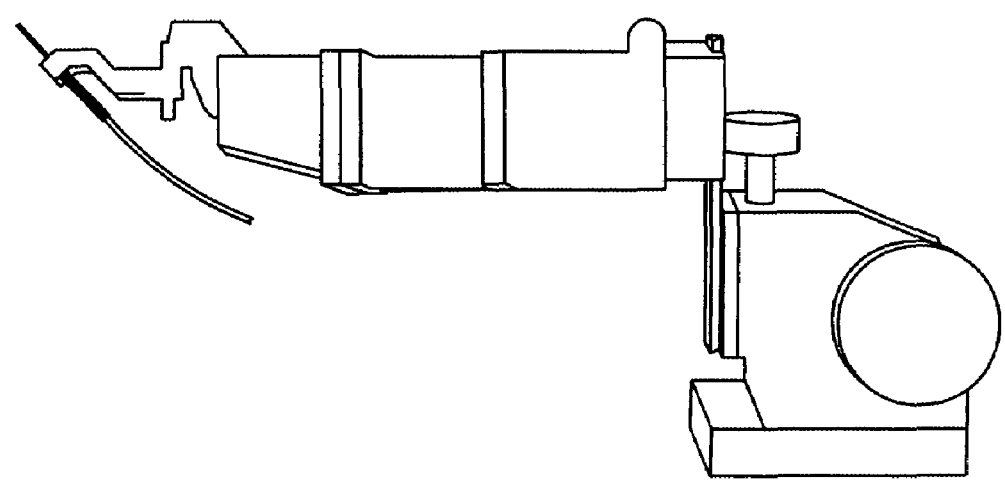
Figure 10L:
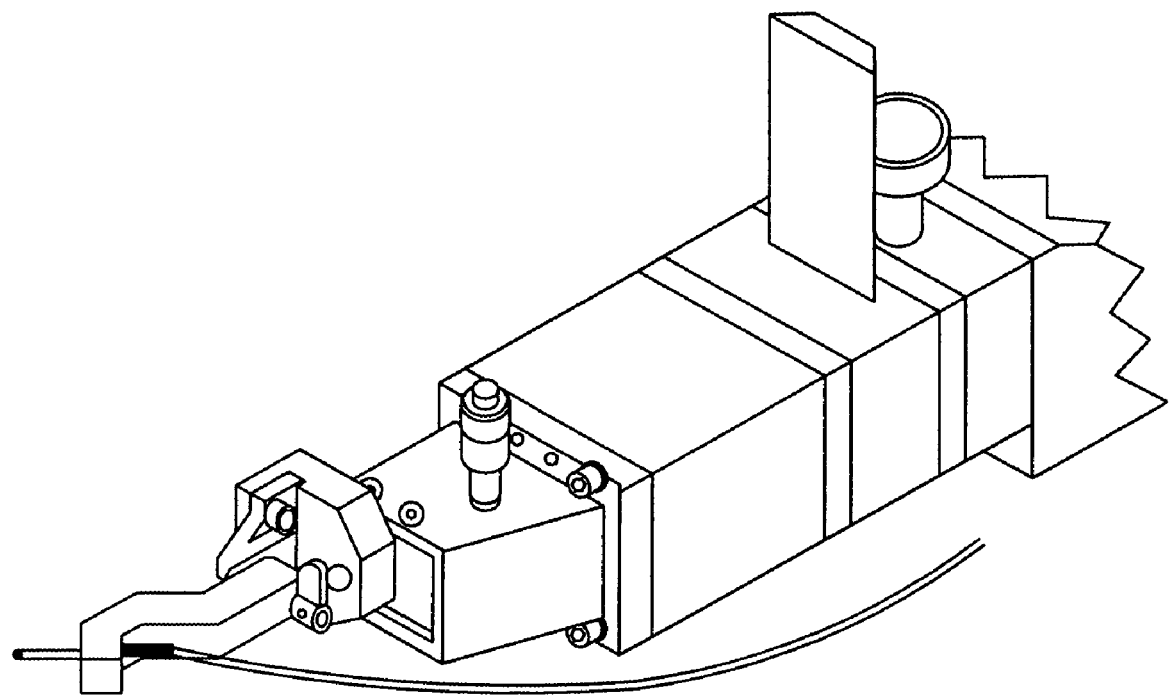
Figure 10M:
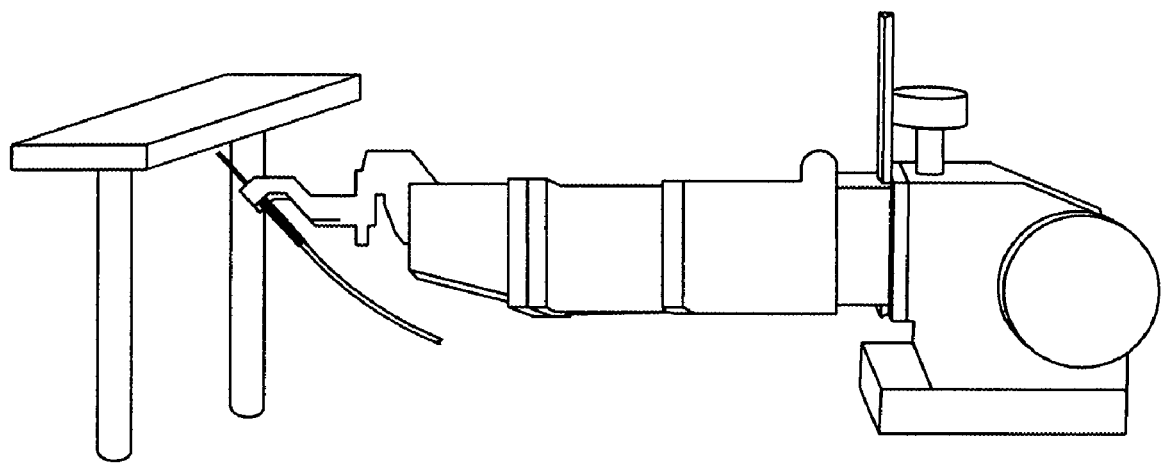
Figure 10N:
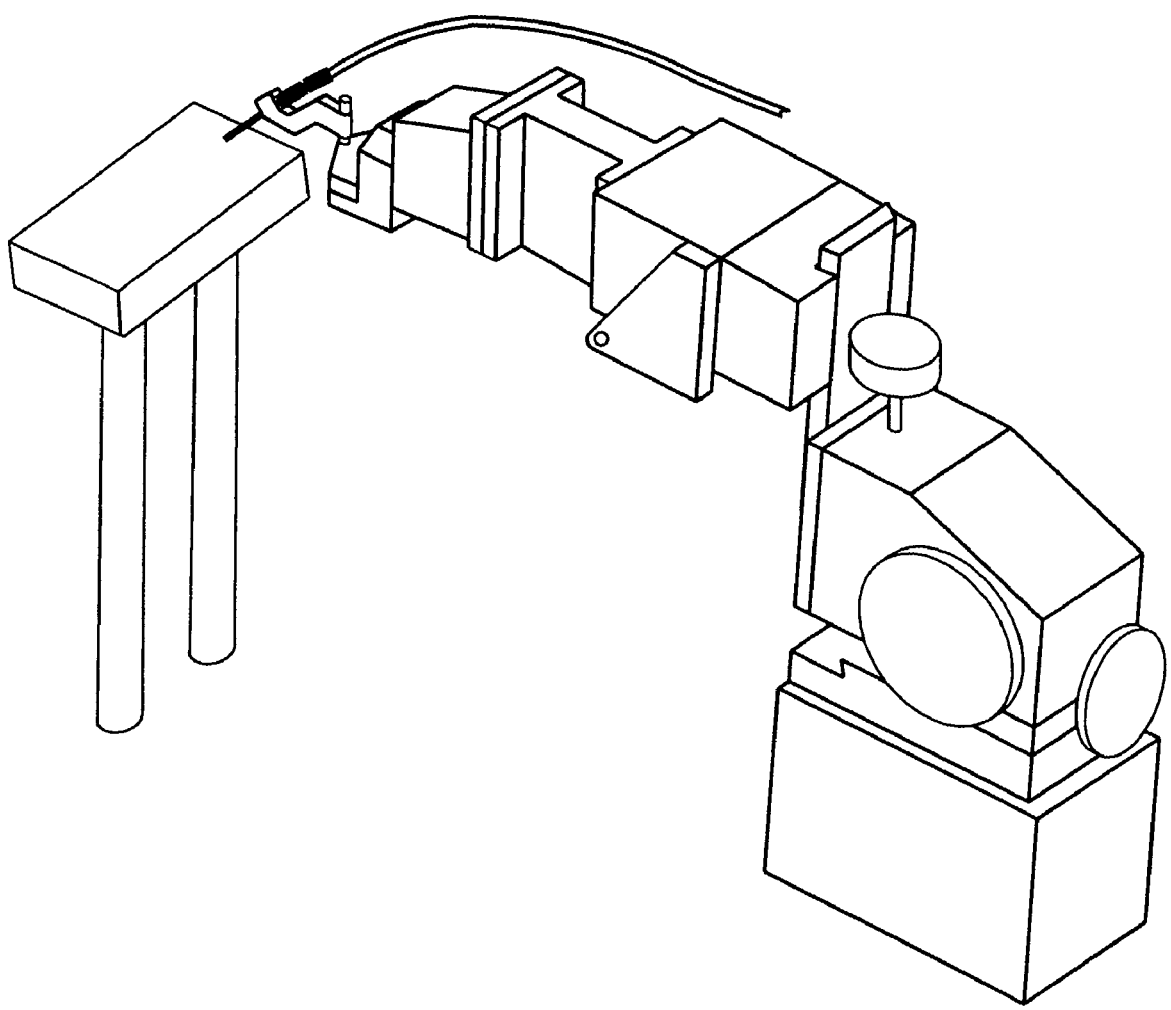

Referring to FIGS. 10A-NN, other embodiments are illustrated.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probing structure comprising:
 (a) a holder for supporting a device under test;
 (b) a calibration substrate including a calibration structure surface;
 (c) a probe element including a contacting portion; and
 (d) a probe positioner supporting said probe element, said probe element supportable in a first orientation enabling said contacting portion to engage said calibration structure surface and, alternatively, supportable in a second orientation enabling said contacting portion to engage said device under test, said probe positioner comprising a stand and a pivot block hingedly connected to said stand, said stand comprising an adjustment mechanism enabling translation of said pivot block in at least one direction without movement of said stand, said probe element affixed to said pivot block.

2. A probing structure comprising:
 (a) a holder for supporting a device under test;
 (b) a calibration substrate including a calibration structure surface;
 (c) a probe element including a contacting portion; and
 (d) a probe positioner supporting said probe element, said probe element supportable in a first orientation enabling said contacting portion to engage said calibration structure surface and, alternatively, supportable in a second orientation enabling said contacting portion to engage said device under test, said probe positioner comprising a stand and a pivot block hingedly connected to said stand enabling pivoting of said pivot block between a first predefined angular relationship with said stand and a second predefined angular relationship with said stand, said probe element affixed to said pivot block.

3. The probing structure of claim 2 wherein said pivoting of said pivot block is securable in at least one of said first predefined angular relationship and said second predefined angular relationship by a pin engageable simultaneously with said pivot block and said stand.

4. A probe station comprising:
 (a) a probe station support;
 (b) a holder for supporting a device under test having a first probe pad on a first side and a second probe pad on a second side of said device under test, said holder supporting said device under test on said probe station support such that said first probe pad and said second probe pad are simultaneously accessible for probing;
 (c) a calibration substrate including a calibration structure surface, said calibration substrate supported by said probe station support;
 (d) a probe element including a contacting portion; and
 (e) a probe positioner supporting said probe element on said probe station support, said probe element supportable in a first orientation to said probe station support enabling said contacting portion to engage said first probe pad and movable, without movement of said probe positioner relative to said probe station support, to a second orientation to said probe station support to enable engagement with at least one of said second probe pad and said calibration structure surface.

5. The probe station of claim 4 wherein said first side and said second side of said device under test are arranged substantially normal to said probe station support and said calibration structure surface is arranged substantially parallel to said probe station support.

6. The probe station of claim 4 wherein said first side and said second side of said device under test are arranged substantially parallel to said probe station support and said calibration structure surface is arranged substantially normal to said probe station support.

7. The probe station of claim 4 wherein said first side and said second side of said device under test and said calibration structure surface are arranged substantially parallel to said probe station support.

8. The probe station of claim 4 wherein said first side and said second side of said device under test and said calibration structure surface are arranged substantially normal to said probe station support.

9. The probe station of claim 4 wherein said probe positioner comprises:
 (a) a stand supported by said probe station support; and
 (b) a pivot block hingedly connected to said stand, said probe element affixed to said pivot block.

10. The probe station of claim 9 wherein said stand comprises an adjustment mechanism enabling translation of said pivot block in at least one direction without movement of said stand on said probe station support.

11. The probe station of claim 9 wherein said hinged connection enables pivoting of said pivot block between a first predefined angular relationship with said probe station support and a second predefined angular relationship with said probe station support.

12. The probe station of claim 11 wherein said pivoting of said pivot block is securable in at least one of said first predefined angular relationship and said second predefined angular relationship by a pin engageable simultaneously with said pivot block and said stand.

* * * * *